(12) United States Patent
Yamazaki et al.

(10) Patent No.: US 8,482,001 B2
(45) Date of Patent: Jul. 9, 2013

(54) SEMICONDUCTOR DEVICE

(75) Inventors: Shunpei Yamazaki, Tokyo (JP); Jun Koyama, Kanagawa (JP); Kiyoshi Kato, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 12/976,582

(22) Filed: Dec. 22, 2010

(65) Prior Publication Data

US 2011/0156117 A1  Jun. 30, 2011

(30) Foreign Application Priority Data

Dec. 25, 2009 (JP) .................. 2009-296201

(51) Int. Cl.
*H01L 27/12* (2006.01)
(52) U.S. Cl.
USPC ............. 257/43; 257/72; 257/83; 257/290; 257/257
(58) Field of Classification Search
USPC .............. 257/43, E29.296, 72, 83, 157, 290, 257/E27.112, E27.131
See application file for complete search history.

(56) References Cited

U.S. PATENT DOCUMENTS

| | | | |
|---|---|---|---|
| 4,466,081 A | 8/1984 | Masuoka | |
| 5,349,366 A | 9/1994 | Yamazaki et al. | |
| 5,366,922 A | 11/1994 | Aoki et al. | |
| 5,731,856 A | 3/1998 | Kim et al. | |
| 5,744,864 A | 4/1998 | Cillessen et al. | |
| 5,796,650 A | 8/1998 | Wik et al. | |
| 5,851,866 A | 12/1998 | Son | |
| 5,936,881 A | 8/1999 | Kawashima et al. | |
| 6,127,702 A | 10/2000 | Yamazaki et al. | |
| 6,266,269 B1 | 7/2001 | Karp et al. | |
| 6,294,274 B1 | 9/2001 | Kawazoe et al. | |
| 6,515,511 B2 | 2/2003 | Sugibayashi et al. | |

(Continued)

FOREIGN PATENT DOCUMENTS

| | | |
|---|---|---|
| EP | 1727154 A1 | 11/2006 |
| EP | 1 737 044 A1 | 12/2006 |

(Continued)

OTHER PUBLICATIONS

Kim, M. et al., "High mobility bottom gate InGaZnO thin film transistors with SiOx etch stopper," Appl. Phys. Lett. (Applied Physics Letters), May 24, 2007, vol. 90, No. 21, pp. 212114-1-212114-3, in English.

(Continued)

*Primary Examiner* — Tran Tran
(74) *Attorney, Agent, or Firm* — Fish & Richardson P.C.

(57) ABSTRACT

An object of the present invention is to provide a semiconductor device having a novel structure in which in a data storing time, stored data can be stored even when power is not supplied, and there is no limitation on the number of writing. A semiconductor device includes a first transistor including a first source electrode and a first drain electrode; a first channel formation region for which an oxide semiconductor material is used and to which the first source electrode and the first drain electrode are electrically connected; a first gate insulating layer over the first channel formation region; and a first gate electrode over the first gate insulating layer. One of the first source electrode and the first drain electrode of the first transistor and one electrode of a capacitor are electrically connected to each other.

17 Claims, 11 Drawing Sheets

U.S. PATENT DOCUMENTS

| | | |
|---|---|---|
| 6,563,174 B2 | 5/2003 | Kawasaki et al. |
| 6,628,551 B2 | 9/2003 | Jain |
| 6,727,522 B1 | 4/2004 | Kawasaki et al. |
| 6,808,971 B2 | 10/2004 | Bhattacharyya |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,339,235 B1 | 3/2008 | Yamazaki et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,483,013 B2 | 1/2009 | Osame |
| 7,501,293 B2 | 3/2009 | Ito et al. |
| 7,601,984 B2 | 10/2009 | Sano et al. |
| 7,674,650 B2 | 3/2010 | Akimoto et al. |
| 7,687,331 B2 | 3/2010 | Kim et al. |
| 7,732,819 B2 | 6/2010 | Akimoto et al. |
| 7,741,644 B2 | 6/2010 | Lyu et al. |
| 7,791,074 B2 | 9/2010 | Iwasaki |
| 7,935,581 B2 | 5/2011 | Hwang |
| 2001/0015450 A1 | 8/2001 | Sugibayashi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0280000 A1 | 12/2005 | Ishii et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0216877 A1 | 9/2006 | Toyota et al. |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara |
| 2006/0262483 A1 | 11/2006 | Osame |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1* | 6/2008 | Lee et al. ..................... 257/43 |
| 2008/0129195 A1 | 6/2008 | Ishizaki et al. |
| 2008/0149984 A1 | 6/2008 | Chang et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0315193 A1 | 12/2008 | Kim et al. |
| 2009/0002590 A1 | 1/2009 | Kimura |
| 2009/0008638 A1 | 1/2009 | Kang et al. |
| 2009/0027371 A1 | 1/2009 | Lin et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0184315 A1* | 7/2009 | Lee et al. ..................... 257/43 |
| 2009/0186437 A1 | 7/2009 | Akimoto |
| 2009/0186445 A1 | 7/2009 | Akimoto |
| 2009/0189153 A1 | 7/2009 | Iwasaki et al. |
| 2009/0189155 A1 | 7/2009 | Akimoto |
| 2009/0189156 A1 | 7/2009 | Akimoto |
| 2009/0278122 A1 | 11/2009 | Hosono et al. |
| 2009/0280600 A1 | 11/2009 | Hosono et al. |
| 2010/0003783 A1 | 1/2010 | Akimoto |
| 2010/0038639 A1 | 2/2010 | Akimoto |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0148171 A1 | 6/2010 | Hayashi et al. |
| 2010/0193785 A1 | 8/2010 | Kimura |
| 2010/0203673 A1 | 8/2010 | Hayashi et al. |
| 2010/0276685 A1 | 11/2010 | Itagaki et al. |
| 2010/0276689 A1 | 11/2010 | Iwasaki |
| 2010/0279462 A1 | 11/2010 | Iwasaki |
| 2011/0089417 A1 | 4/2011 | Yamazaki et al. |
| 2011/0089419 A1 | 4/2011 | Yamazaki et al. |
| 2011/0101332 A1 | 5/2011 | Yamazaki et al. |
| 2011/0101334 A1 | 5/2011 | Yamazaki et al. |
| 2011/0101339 A1 | 5/2011 | Yamazaki et al. |
| 2011/0101351 A1 | 5/2011 | Yamazaki |
| 2011/0108706 A1 | 5/2011 | Koyama |
| 2011/0108836 A1 | 5/2011 | Koyama et al. |
| 2011/0110145 A1 | 5/2011 | Yamazaki et al. |
| 2011/0116310 A1 | 5/2011 | Yamazaki et al. |
| 2011/0121285 A1 | 5/2011 | Yamazaki et al. |
| 2011/0121286 A1 | 5/2011 | Yamazaki et al. |
| 2011/0122670 A1 | 5/2011 | Yamazaki et al. |
| 2011/0122673 A1 | 5/2011 | Kamata et al. |
| 2011/0128777 A1 | 6/2011 | Yamazaki et al. |
| 2011/0134683 A1 | 6/2011 | Yamazaki et al. |
| 2011/0147737 A1 | 6/2011 | Yamazaki et al. |
| 2011/0156027 A1 | 6/2011 | Yamazaki et al. |
| 2011/0156028 A1 | 6/2011 | Yamazaki et al. |
| 2011/0157961 A1 | 6/2011 | Yamazaki et al. |

FOREIGN PATENT DOCUMENTS

| | | |
|---|---|---|
| EP | 2 226 847 A2 | 9/2010 |
| JP | 47016085 A1 | 8/1972 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |

| | | |
|---|---|---|
| JP | 63-239117 A | 10/1988 |
| JP | 63-265818 A | 11/1988 |
| JP | 63268184 A | 11/1988 |
| JP | 02-044763 A | 2/1990 |
| JP | 05-119298 A | 5/1993 |
| JP | 05-251705 A | 9/1993 |
| JP | 08-264794 A | 10/1996 |
| JP | 09-045925 A | 2/1997 |
| JP | 10093100 A | 4/1998 |
| JP | 11-505377 A | 5/1999 |
| JP | 11233789 A | 8/1999 |
| JP | 2000-044236 A | 2/2000 |
| JP | 2000-150900 A | 5/2000 |
| JP | 2001230326 A | 8/2001 |
| JP | 2002-076356 A | 3/2002 |
| JP | 2002-289859 A | 10/2002 |
| JP | 2002368226 A | 12/2002 |
| JP | 2003-086000 A | 3/2003 |
| JP | 2003-086808 A | 3/2003 |
| JP | 2003101407 A | 4/2003 |
| JP | 2004-103957 A | 4/2004 |
| JP | 2004-273614 A | 9/2004 |
| JP | 2004-273732 A | 9/2004 |
| JP | 2006-165532 A | 6/2006 |
| JP | 2006-216969 A | 8/2006 |
| JP | 2006352090 A | 12/2006 |
| JP | 2007-103918 A | 4/2007 |
| JP | 2008160125 A | 7/2008 |
| JP | 2009-033145 A | 2/2009 |
| JP | 2009099953 A | 5/2009 |
| JP | 2009135350 A | 6/2009 |
| JP | 2009-152633 A | 7/2009 |
| JP | 2009-182194 A | 8/2009 |
| WO | 2004/114391 A1 | 12/2004 |
| WO | 2007/029844 A1 | 3/2007 |
| WO | 2007/058329 A1 | 5/2007 |
| WO | 2009041713 A2 | 4/2009 |
| WO | 2009/087943 A1 | 7/2009 |

OTHER PUBLICATIONS

International Search Report, PCT Application No. PCT/JP2010/071948, dated Feb. 15, 2011, 5 pages.

Written Opinion, PCT Application No. PCT/JP2010/071948, dated Feb. 15, 2011, 4 pages.

Ohara, H et al., "Amorphous In-Ga-Zn-Oxide TFTs with Suppressed Venation for 4.0 inch QVGA Amoled Display," AM-FPD '09 Digest of Technical Papers, Jul. 1, 2009, pp. 227-230, The Japan Society of Applied Physics.

Orita, M et al., "Amorphous transparent condutive oxide InGaO3(ZnO)m (m<4):aZn4s conductor," Philosophical Magazine, 2001, vol. 81, No. 5, pp. 501-515.

Orita, M et al., "Mechanism of Electrical Conductivity oF Transparent InGaZnO4," Phys. Rev. B (Physical Review, B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Galuum Zinc Oxide Thin-Film Transistors by Ar Plasma Treatment," Appl, Phys. Lett (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size Amoled," AM-FPD '08 Digest of Technical Papers, Juiy 2, 2008, pp. 275-278.

Park, S et al., "Challenge to Future Displays: Transparent AM-OLED Driven by Peald Grown ZNO TFT," IMID '07 Digest, 2007, pp. 1249-1252.

Prins, M. et al., "A Ferroelectric Transparent Thin-Film Transistor, " Appl. Phys. Lett. (Applied Physics Letters), Jun. 17, 1996, vol. 68, No. 25, pp. 3650-3652.

Sakata, J et al., "Development of 4.0-In. Amoled Display With Driver Circuit Using Amorphous IN-GA-ZN-Oxide TFTS, " IDW '09 : Proceedings of the 16th International Display Workshops, 2009, pp. 689-692.

Son, K et al., "42.4L: Late-News Paper: 4 Inch QVGA Amoled Driven by the Threshold Voltage Controlled Amorphous GIZO (Ga2O3-In2O3-ZnO) TFT, " SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semicondutor, "IDW '08 : Proceedings of the 15th International Display Workshops, Dec. 3, 2008, pp. 1637-1640.

Tsuda, K et al., "Ultra Low Power Consumption Technologies for Mobile TFT-LCDs, " IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C. "Hygrogen as a Cause of Doping in Zinc Oxide, " Phys. Rev. Lett. (Physical Review Letters), Jul. 31, 2000, vol. 85, No. 5, pp. 1012-1015.

Asakuma, N et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility Zno Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1:Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (Zno TFTS) for AMLCDS," Journal of the SID , 2007, vol. 15, No. 1, pp. 17-22.

Hosono H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using Cg-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecnt Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures over 1000° C.," Journal of Solid State Chemistry, 1985, vol. 60, pp. 382-384.

Kimizuka, N et al., "Syntheses and Sindle-Crystal Data of Homologous Compounds, In2O3(ZnO)m (m = 3, 4, and 5) InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 28, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Tansparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp, 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In-Ga-Zn-Oxide TFTS With a Novel Passivation Layer," SID Digest '09 : SID International Symposium Digest of Technical Papers, May 31, 2009, pp. 284-287.

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

Kim, W et al., "An Experimental High-Density DRAM Cell with a Built-in Gain Stage," IEEE Journal of Solid-State Circuits, Aug. 1, 1994, vol. 29, No. 8, pp. 978-981.

Shukuri, S et al., "A Complementary Gain Cell Technology for Sub-1 V Supply DRAMs," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

Chul-Kyu Kang et al.; "4.2: Integrated Scan Driver with Oxide TFTs Using Floating Gate Method"; SID Digest '11 : SID International Symposium Digest of Technical Papers; 2011; pp. 25-27.

* cited by examiner

FIG. 2A1
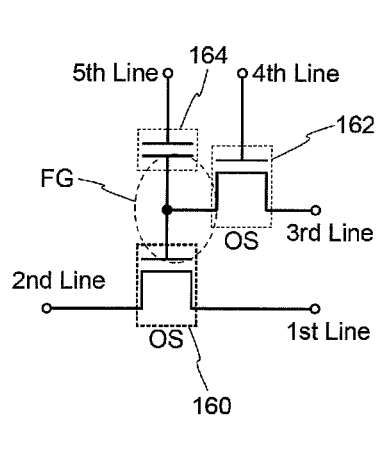
FIG. 2A2
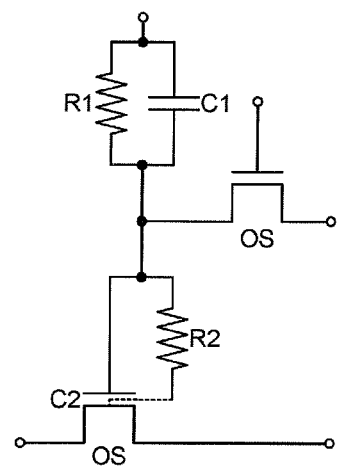
FIG. 2B
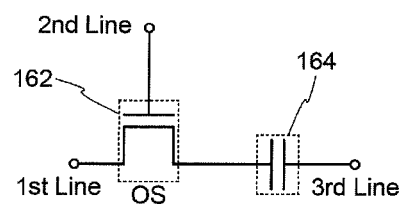

SEMICONDUCTOR DEVICE

TECHNICAL FIELD

The disclosed invention relates to a semiconductor device using a semiconductor element and a manufacturing method of the semiconductor device.

BACKGROUND ART

Memory devices using semiconductor elements are broadly classified into two categories: a volatile memory device that loses stored data when power supply stops, and a non-volatile memory device that stores stored data even when power is not supplied.

A typical example of a volatile memory device is a DRAM (dynamic random access memory). A DRAM stores data in such a manner that a transistor included in a memory element is selected and charge is stored in a capacitor.

When data is read from a DRAM, charge in a capacitor is lost on the above-described principle; thus, another writing operation is necessary whenever data is read out. Moreover, a transistor included in a memory element has leakage current and charge flows into or out of a capacitor even when the transistor is not selected, so that the data storing time is short. For that reason, another writing operation (refresh operation) is necessary at predetermined intervals, and it is difficult to reduce power consumption sufficiently. Furthermore, since stored data is lost when power supply stops, an additional memory device using a magnetic material or an optical material is needed in order to store the data for a long time.

Another example of a volatile memory device is an SRAM (static random access memory). An SRAM stores stored data by using a circuit such as a flip-flop and thus does not need refresh operation. This means that an SRAM has an advantage over a DRAM. However, cost per storage capacity is increased because a circuit such as a flip-flop is used. Moreover, as in a DRAM, stored data in an SRAM is lost when power supply stops.

A typical example of a non-volatile memory device is a flash memory. A flash memory includes a floating gate between a gate electrode and a channel formation region in a transistor and stores data by holding charge in the floating gate. Therefore, a flash memory has advantages in that the data storing time is extremely long (almost permanent) and refresh operation which is necessary in a volatile memory device is not needed (e.g., see Patent Document 1).

However, a gate insulating layer included in a memory element deteriorates by tunneling current which flows in writing, so that the memory element stops its function after a predetermined number of writing operations. In order to reduce adverse effects of this problem, a method in which the number of writing operations for memory elements is equalized is employed, for example. However, complicated supplemental circuits are additionally needed to realize this method. Moreover, employing such a method does not solve the fundamental problem of lifetime. In other words, a flash memory is not suitable for applications in which data is frequently rewritten.

In addition, high voltage is necessary for holding of charge in the floating gate or removal of the charge, and a circuit for generating high voltage is also necessary. Further, it takes a relatively long time to hold or remove charge, and it is not easy to perform writing and erasing at higher speed.

[Reference]
[Patent Document]
Patent Document 1: Japanese Published Patent Application No. S57-105889

DISCLOSURE OF INVENTION

In view of the foregoing problems, an object of one embodiment of the disclosed invention is to provide a semiconductor device where stored data can be stored even when power is not supplied in a data storing time and where there is no limitation on the number of times of writing.

In the disclosed invention, a semiconductor device is formed using a highly purified oxide semiconductor. A transistor formed using a highly purified oxide semiconductor has extremely small leakage current; therefore, data can be stored for a long time.

According to one embodiment of the disclosed invention, a semiconductor device includes a first transistor including a first source electrode and a first drain electrode, a first channel formation region electrically connected to the first source electrode and the first drain electrode and using an oxide semiconductor material, a first gate insulating layer over the first channel formation region, and a first gate electrode over the first gate insulating layer; and a capacitor. One of the first source electrode and the first drain electrode of the first transistor and one electrode of the capacitor are electrically connected to each other.

Further, in the above structure, the capacitor can include the first source electrode or the first drain electrode, the first gate insulating layer, and an electrode for the capacitor over the first gate insulating layer.

In the above structure, the semiconductor device can further include a second transistor including a second source electrode and a second drain electrode, a second channel formation region electrically connected to the second source electrode and the second drain electrode and using an oxide semiconductor material, a second gate insulating layer over the second channel formation region, and a second gate electrode over the second gate insulating layer; a source line; a bit line; a word line; a first signal line; and a second signal line. The second gate electrode, one of the first source electrode and the first drain electrode, and one electrode of the capacitor can be electrically connected to one another. The source line and the second source electrode can be electrically connected to each other. The bit line and the second drain electrode can be electrically connected to each other. The first signal line and the other of the first source electrode and the first drain electrode can be electrically connected to each other. The second signal line and the first gate electrode can be electrically connected to each other. The word line and the other electrode of the capacitor can be electrically connected to each other.

Note that in this specification and the like, the term such as "over" or "below" does not necessarily mean that a component is placed "directly on" or "directly under" another component. For example, the expression "a gate electrode over a gate insulating layer" does not exclude the case where a component is placed between the gate insulating layer and the gate electrode. Moreover, the terms such as "over" and "below" are only used for convenience of description and can include the case where the positional relation of components is reversed, unless otherwise specified.

In addition, in this specification and the like, the term such as "electrode" or "line" does not limit a function of a component. For example, an "electrode" is sometimes used as part of a "line", and vice versa. Furthermore, the term "electrode" or "line" can include the case where a plurality of "electrodes" or "lines" are formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

Note that in this specification and the like, the term "electrically connected" includes the case where components are connected through an "object having any electric function". There is no particular limitation on an "object having any electric function" as long as electric signals can be transmitted and received between components that are connected through the object.

Examples of an "object having any electric function" are a switching element such as a transistor, a resistor, an inductor, a capacitor, and an element with a variety of functions as well as an electrode and a line.

One embodiment of the present invention provides a semiconductor device including a transistor using an oxide semiconductor. Since the off current of a transistor using an oxide semiconductor is extremely low, stored data can be stored for an extremely long time by using the transistor. In other words, power consumption can be considerably reduced because refresh operation becomes unnecessary or the frequency of refresh operation can be extremely low. Moreover, stored data can be stored for a long time even when power is not supplied.

Further, a semiconductor device according to one embodiment of the disclosed invention does not need high voltage for writing of data and there is no problem of deterioration of elements. For example, since there is no need to perform injection of electrons to a floating gate and extraction of electrons from the floating gate which are needed in a conventional nonvolatile memory, deterioration of a gate insulating layer does not occur. In other words, the semiconductor device according to one embodiment of the present invention does not have a limit on the number of times of writing which is a problem in a conventional nonvolatile memory, and reliability thereof is drastically improved. Furthermore, data is written depending on on and off of the transistor, whereby high-speed operation can be easily realized. In addition, there is no need of operation for erasing data, which is another merit.

As described above, according to one embodiment of the disclosed invention, a semiconductor device where stored data can be stored even when power is not supplied and where there is no limitation on the number of times of writing can be provided.

BRIEF DESCRIPTION OF DRAWINGS

In the accompanying drawings:
FIGS. 2A1, 2A2, and 2B are circuit diagrams of a semiconductor device.

BEST MODE FOR CARRYING OUT THE INVENTION

Figure 1A:
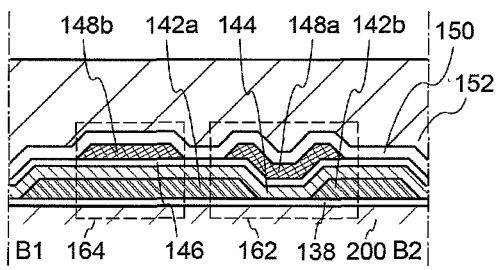
FIGS. 1A to 1D are cross-sectional views each illustrating a semiconductor device.

Examples of embodiments of the present invention will be described below with reference to the accompanying drawings. Note that the present invention is not limited to the following description, and it is easily understood by those skilled in the art that modes and details disclosed herein can be modified in various ways without departing from the spirit and the scope of the present invention. Therefore, the present invention is not to be construed as being limited to the content of the embodiments included herein.

Note that the position, the size, the range, or the like of each structure illustrated in drawings and the like is not accurately represented in some cases for easy understanding. Therefore, the disclosed invention is not necessarily limited to the position, the size, the range, or the like disclosed in the drawings and the like.

In this specification and the like, ordinal numbers such as "first", "second", and "third" are used in order to avoid confusion among components, and the terms do not mean limitation of the number of components.

(Embodiment 1)

In this embodiment, structures and a manufacturing method of a semiconductor device according to one embodiment of the disclosed invention will be described with reference to FIGS. 1A to 1D and FIGS. 2A1, 2A2, and 2B. Note that in some of the circuit diagrams, "OS" is written beside a transistor in order to indicate that the transistor uses an oxide semiconductor.

FIGS. 1A to 1D each illustrate an example of a structure of the semiconductor device. FIGS. 1A to 1D each illustrate a cross section of the semiconductor device. The semiconductor devices illustrated in FIGS. 1A to 1D each include a transistor 162 using an oxide semiconductor and a capacitor 164.

Although all the transistors are described as n-channel transistors here, it is needless to say that p-channel transistors can be used. Since the technical nature of the disclosed invention is to use an oxide semiconductor in the transistor 162 so that data can be stored, it is not necessary to limit a specific structure of a semiconductor device to the structure described here.

The transistor 162 in FIG. 1A includes a source or drain electrode 142a, a source or drain electrode 142b over a substrate 200 with an insulating layer 138 therebetween, an oxide semiconductor layer 144 electrically connected to the source or drain electrode 142a and the source or drain electrode 142b, a gate insulating layer 146 covering the source or drain electrode 142a, the source or drain electrode 142b, and the oxide semiconductor layer 144, and a gate electrode 148a provided over the gate insulating layer 146 so as to overlap with the oxide semiconductor layer 144.

Here, the oxide semiconductor layer 144 is preferably an oxide semiconductor layer which is highly purified by sufficiently removing impurity such as hydrogen therefrom or by supplying a sufficient amount of oxygen thereto. Specifically, the hydrogen concentration of the oxide semiconductor layer 144 is $5\times10^{19}$ atoms/cm$^3$ or lower, preferably $5\times10^{18}$ atoms/cm$^3$ or lower, more preferably $5\times10^{12}$ atoms/cm$^3$ or lower. Note that the hydrogen concentration of the oxide semiconductor layer 144 is measured by secondary ion mass spectrometry (SIMS). In the oxide semiconductor layer 144 which is highly purified by sufficiently reducing the concentration of hydrogen therein and in which defect levels in an energy gap due to oxygen deficiency are reduced by supplying a sufficient amount of oxygen, the carrier concentration is lower than $1\times10^{12}$/cm$^3$, preferably lower than $1\times10^{11}$/cm$^3$, more preferably lower than $1.45\times10^{10}$/cm$^3$. For example, the off current density (a value obtained by dividing the off current by the channel width of the transistor) at room temperature is approximately 10 zA/μm to 100 zA/μm (1 zA (zeptoampere) is $1\times10^{-21}$ A). The transistor 162 with significantly excellent off current characteristics can be obtained with the use of such an oxide semiconductor which is made to be an i-type (intrinsic) oxide semiconductor or a substantially i-type oxide semiconductor.

Note that since the oxide semiconductor layer 144 is not patterned to have an island shape in the transistor 162 in FIG. 1A, the oxide semiconductor layer 144 is prevented from being contaminated by etching for patterning.

The capacitor 164 includes the source or drain electrode 142a, the oxide semiconductor layer 144, the gate insulating layer 146, and an electrode 148b. That is, the source or drain electrode 142a functions as one electrode of the capacitor 164 and the electrode 148b functions as the other electrode of the capacitor 164.

Note that in the capacitor 164 illustrated in FIG. 1A, insulating properties between the source or drain electrode 142a and the electrode 148b can be adequately secured by stacking the oxide semiconductor layer 144 and the gate insulating layer 146.

Note that in the transistor 162 and the capacitor 164, edge portions of the source or drain electrode 142a, the source or drain electrode 142b, and an insulating layer 143 are preferably tapered. Here, a taper angle is, for example, greater than or equal to 30° and less than or equal to 60°. Note that the "taper angle" means an inclination angle formed by a side surface and a bottom surface of a layer (for example, the source or drain electrode 142a) having a tapered shape when being observed in a direction perpendicular to the cross-section (a plane which is perpendicular to the surface of the substrate). When the edge portions of the source or drain electrode 142a and the source or drain electrode 142b are tapered, the coverage of the oxide semiconductor layer 144 can be improved and disconnection can be prevented.

Further, an interlayer insulating layer 150 is provided over the transistor 162 and the capacitor 164 and an interlayer insulating layer 152 is provided over the interlayer insulating layer 150.

Figure 1B:
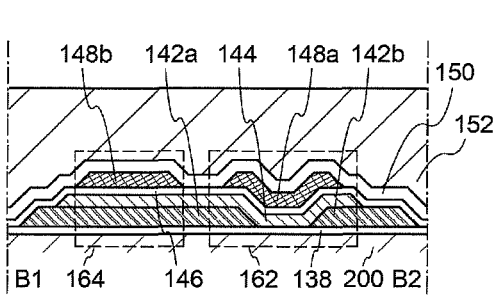

The transistor and the capacitor which are illustrated in FIG. 1B are the modified examples of the transistor and capacitor which are illustrated in FIG. 1A.

The structure illustrated in FIG. 1B is different from that illustrated in FIG. 1A in that the former includes the oxide semiconductor layer which is formed to have an island shape. That is, in the structure illustrated in FIG. 1A, the oxide semiconductor layer 144 entirely covers the insulating layer 138, the source or drain electrode 142a, and the source or drain electrode 142b: on the other hand, in the structure illustrated in FIG. 1B, the island-shaped oxide semiconductor layer 144 partly covers the insulating layer 138, the source or drain electrode 142a, and the source or drain electrode 142b. Here, edge portions of the island-shaped oxide semiconductor layer 144 are preferably tapered. It is preferable that a taper angle be greater than or equal to 30° and less than or equal to 60°, for example.

Further, in the capacitor 164, insulating properties between the source or drain electrode 142a and the electrode 148b can be adequately secured by stacking the oxide semiconductor layer 144 and the gate insulating layer 146.

Figure 1C:
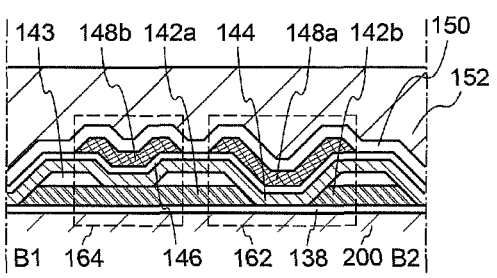

The transistor and the capacitor which are illustrated in FIG. 1C are other modified examples of the transistor and the capacitor which are illustrated in FIG. 1A.

The structure illustrated in FIG. 1C is different from the structure illustrated in FIG. 1A in that the former includes the insulating layer 143 which is formed over the source or drain electrode 142a and the source or drain electrode 142b. Further, the oxide semiconductor layer 144 is formed so as to cover the insulating layer 143, the source or drain electrode 142a, and the source or drain electrode 142b. In addition, in the structure illustrated in FIG. 1C, the oxide semiconductor layer 144 is provided in contact with the source or drain electrode 142a through an opening formed in the insulating layer 143.

When the insulating layer 143 is provided, capacitance which is formed between the gate electrode and the source electrode and between the gate electrode and the drain electrode is reduced and high-speed operation of the transistor can be realized.

Figure 1D:
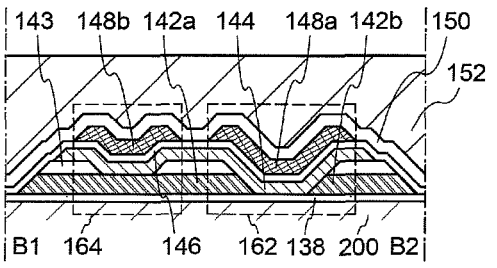

The transistor and the capacitor which are illustrated in FIG. 1D are partly different from the transistors and the capacitors which are illustrated in FIGS. 1B and 1C.

The structure illustrated in FIG. 1D is different from that illustrated in FIG. 1B in that the former includes the insulating layer 143 formed over the source or drain electrode 142a and the source or drain electrode 142b. Further, the oxide semiconductor layer 144 is formed so as to cover the insulating layer 143, the source or drain electrode 142a, and the source or drain electrode 142b. Moreover, the structure illustrated in FIG. 1D is different from that illustrated in FIG. 1C in that the former includes the oxide semiconductor layer 144 which is formed to have an island shape. With such a structure, both an effect which can be obtained in the structure illustrated in FIG. 1B and an effect which can be obtained in the structure illustrated in FIG. 1C can be obtained.

<Circuit Configuration and Operation of Semiconductor Device>

Next, an example of a circuit configuration of the above semiconductor device and operation thereof are described. FIGS. 2A1, 2A2, and 2B illustrate examples of a circuit configuration in which the semiconductor device illustrated in FIG. 1A, FIG. 1B, FIG. 1C, or FIG. 1D is used.

In a semiconductor device illustrated in FIG. 2A1, a first line (also referred to as a source line) and a source electrode of a transistor 160 are electrically connected to each other, and a second line (also referred to as a bit line) and a drain electrode of the transistor 160 are electrically connected to each other. Further, a third line (also referred to as a first signal line) and one of the source electrode and the drain electrode of the transistor 162 are electrically connected to each other, and a fourth line (also referred to as a second signal line) and the gate electrode of the transistor 162 are electrically connected to each other. A gate electrode of the transistor 160, the other of the source electrode and the drain electrode of the transistor 162, and the one electrode of the capacitor 164 are electrically connected to one another. Further, a fifth line (also referred to as a word line) and the other electrode of the capacitor 164 are electrically connected to each other.

Here, a transistor using the above described oxide semiconductor is used as the transistor 160 and the transistor 162.

A transistor using the above described oxide semiconductor has a characteristic of significantly low off current. Therefore, when the transistor 162 is turned off, the potential of the gate electrode of the transistor 160 can be held for an extremely long time. Providing the capacitor 164 facilitates holding of charge given to the gate electrode of the transistor 160 and reading of stored data. Note that the transistor 162 using an oxide semiconductor has a channel length (L) greater than or equal to 10 nm and less than or equal to 1000 nm and thus consumes a small amount of power and operates at extremely high speed.

The semiconductor device in FIG. 2A1 utilizes a characteristic in which the potential of the gate electrode of the transistor 160 can be held, whereby writing, holding, and reading of data can be performed as follows.

Firstly, writing and storing of data will be described. First, the potential of the fourth line is set to potential which allows the transistor 162 to be turned on, so that the transistor 162 is turned on. Accordingly, the potential of the third line is supplied to the gate electrode of the transistor 160 and the capacitor 164. That is, predetermined charge is given to the gate electrode of the transistor 160 (writing). Here, charge for supply of a potential level or charge for supply of a different potential level (hereinafter referred to as Low level charge and High level charge) is given. After that, the potential of the fourth line is set to potential which allows the transistor 162 to be turned off, so that the transistor 162 is turned off. Thus, the charge given to the gate electrode of the transistor 160 is held (storing).

Since the off current of the transistor 162 is significantly low, the charge of the gate electrode of the transistor 160 is held for a long time.

Next, reading of data will be described. By supplying appropriate potential (reading potential) to the fifth line while predetermined potential (constant potential) is supplied to the first line, the potential of the second line varies depending on the amount of charge held in the gate electrode of the transistor 160. This is because in general, when the transistor 160 is an n-channel transistor, apparent threshold voltage $V_{th\_H}$ in the case where High level charge is given to the gate electrode of the transistor 160 is lower than apparent threshold voltage $V_{th\_L}$ in the case where Low level charge is given to the gate electrode of the transistor 160. Here, apparent threshold voltage refers to the potential of the fifth line, which is needed to turn on the transistor 160. Thus, the potential of the fifth line is set to potential $V_0$ intermediate between $V_{th\_H}$ and $V_{th\_L}$, whereby charge given to the gate electrode of the transistor 160 can be determined. For example, in the case where High level charge is given in writing, when the potential of the fifth line is set to $V_0$ ($>V_{th\_H}$), the transistor 160 is turned on. In the case where Low level charge is given in writing, even when the potential of the fifth line is set to $V_0$ ($<V_{th\_L}$), the transistor 160 remains in an off state. Therefore, the stored data can be read by the potential of the second line.

Note that in the case where memory cells are arrayed to be used, only data of a desired memory cell is necessary to be read. Thus, in order that data of a predetermined memory cell is read and data of the other memory cells is not read, in the case where the transistors 160 are connected in parallel between the memory cells, potential which allows the transistor 160 to be turned off regardless of a state of the gate electrode, that is, potential lower than $V_{th\_H}$ may be supplied to fifth lines of the memory cells whose data is not to be read. In the case where the transistors 160 are connected in series between the memory cells, potential which allows the transistor 160 to be turned on regardless of the state of the gate electrode, that is, potential higher than $V_{th\_L}$ may be supplied to the fifth lines.

Next, rewriting of data will be described. Rewriting of data is performed similarly to the writing and storing of data. That is, the potential of the fourth line is set to potential which allows the transistor 162 to be turned on, so that the transistor 162 is turned on. Accordingly, the potential of the third line (potential related to new data) is supplied to the gate electrode of the transistor 160 and the capacitor 164. After that, the potential of the fourth line is set to potential which allows the transistor 162 to be turned off, so that the transistor 162 is turned off. Accordingly, charge related to new data is given to the gate electrode of the transistor 160.

In the semiconductor device according to the disclosed invention, data can be directly rewritten by another writing of data as described above. Therefore, erasing operation which is necessary for a flash memory and the like is not needed, and reduction in operation speed, which is attributed to erasing operation, can be suppressed. In other words, high-speed operation of the semiconductor device can be realized.

Note that the source electrode or the drain electrode of the transistor 162 is electrically connected to the gate electrode of the transistor 160, thereby having an effect similar to an effect of a floating gate of a floating gate transistor used for a nonvolatile memory element. Therefore, a portion in the drawing where the source electrode or the drain electrode of the transistor 162 and the gate electrode of the transistor 160 are electrically connected to each other is called a floating gate portion FG in some cases. When the transistor 162 is off, the floating gate portion FG can be regarded as being embedded in an insulator and thus charge is held in the floating gate portion FG. The amount of off current of the transistor 162 using an oxide semiconductor is less than or equal to one hundred thousandth of the amount of off current of a transistor formed using silicon or the like; thus, lost of the charge accumulated in the floating gate portion FG due to leakage current of the transistor 162 is negligible. That is, with the transistor 162 using an oxide semiconductor, a nonvolatile memory device can be realized.

For example, when the off current density of the transistor 162 is approximately 10 zA (1 zA (zeptoampere) is $1\times10^{-21}$ A) at room temperature and the capacitance value of the capacitor 164 is approximately 1 pF, data can be stored at least for $10^6$ seconds or longer. It is needless to say that the storing time depends on transistor characteristics and the capacitance value.

Further, in that case, the problem of deterioration of a gate insulating film (a tunnel insulating film), which is pointed out in a conventional floating gate transistor, does not exist. That is to say, the deterioration of a gate insulating film due to injection of an electron into a floating gate, which has been conventionally regarded as a problem, can be avoided. This means that there is no limit on the number of times of writing in principle. Furthermore, high voltage needed for writing or erasing in a conventional floating gate transistor is not necessary.

A circuit structure of the semiconductor device illustrated in FIG. 2A1 can be replaced with a circuit structure illustrated in FIG. 2A2 in which the components such as the transistors in the semiconductor device include a resistor and a capacitor. That is, in FIG. 2A2, the transistor 160 and the capacitor 164 are each regarded as including a resistor and a capacitor. R1 and C1 denote the resistance value and the capacitance value of the capacitor 164, respectively. The resistance value R1 corresponds to a resistance value which depends on the insulating layer included in the capacitor 164. R2 and C2 denote the resistance value and the capacitance value of the transistor 160, respectively. The resistance value R2 corresponds to a resistance value which depends on the gate insulating layer included in the transistor 160 at the time when the transistor 160 is on. The capacitance value C2 corresponds to so-called gate capacitance (capacitance formed between the gate electrode and the source electrode and between the gate electrode and the drain electrode) value. Note that the resistance value R2 only denotes the resistance value between the gate electrode and the channel formation region of the transistor 160, and in order that this point is clarified, part of the connection is represented by a dotted line.

A charge holding time (which can be also referred to as a data storing time) is determined mainly by off current of the transistor 162 in the case where R1 and R2 satisfy R1≧ROS (R1 is ROS or more) and R2 ROS (R2 is ROS or more), where the resistance value (also referred to as effective resistance) between the source electrode and the drain electrode when the transistor 162 is off is ROS.

On the other hand, when the above relation is not satisfied, it is difficult to sufficiently secure the holing time even if the off current of the transistor 162 is sufficiently low. This is because the amount of leakage current generated in part other than the transistor 162 is large. Thus, it can be said that the above relation is desirably satisfied in the semiconductor device disclosed in this embodiment.

It is desirable that C1 and C2 satisfy C1≧C2 (C1 is C2 or more). If C1 is large, variation in the potential of the fifth line can be made small when the potential of the floating gate portion FG is controlled by the fifth line (e.g., at the time of reading).

When the above relation is satisfied, a more preferable semiconductor device can be realized. Note that R1 and R2 are controlled by the gate insulating layers of the transistor 160 and the transistor 162. C1 and C2 are similarly controlled. Therefore, the material, the thickness, and the like of the gate insulating layer are desirably set as appropriate so that the above relation is satisfied.

A semiconductor device illustrated in FIG. 2B is a semiconductor device having a structure in which the transistor 160 illustrated in FIG. 2A1 is not provided. In the semiconductor device illustrated in FIG. 2B, a first line (also referred to as a first signal line) and one of the source electrode and the drain electrode of the transistor 162 are electrically connected to each other. A second line (also referred to as a second signal line) and the gate electrode of the transistor 162 are electrically connected to each other. Further, the other of the source electrode and the drain electrode of the transistor 162 and the one electrode of the capacitor 164 are electrically connected to each other. A third line (also referred to as a capacitor line) and the other electrode of the capacitor 164 are electrically connected to each other.

Here, a transistor using the above oxide semiconductor is used as the transistor 162. A transistor using the above oxide semiconductor has a characteristic of significantly low off current. Therefore, when the transistor 162 is turned off, the potential supplied to the capacitor 164 can be held for an extremely long time. Note that the transistor 162 using an oxide semiconductor has a channel length (L) greater than or equal to 10 nm and less than or equal to 1000 nm and thus consumes a small amount of power and operates at extremely high speed.

The semiconductor device illustrated in FIG. 2B utilizes a characteristic in which the potential supplied to the capacitor 164 can be held, whereby writing, storing, and reading of data can be performed as follows.

Firstly, writing and storing of data will be described. For simplicity, the potential of the third line is fixed here. First, the potential of the second line is set to potential which allows the transistor 162 to be turned on, so that the transistor 162 is turned on. In this manner, the potential of the first line is supplied to the one electrode of the capacitor 164. That is, predetermined charge is given to the capacitor 164 (writing). After that, the potential of the second line is set to potential which allows the transistor 162 to be turned off, so that the transistor 162 is turned off. Thus, the charge given to the capacitor 164 is held (storing). The transistor 162 has extremely low off current as described above and thus can hold charge for a long time.

Next, reading of data will be described. By setting the potential of the second line to potential which allows the transistor 162 to be turned on while predetermined potential (constant potential) is supplied to the first line, the potential of the first line varies depending on the amount of charge held in the capacitor 164. Therefore, the stored data can be read by the potential of the first line.

Since the charge of the capacitor 164 is lost in the case where the data is read, it is to be noted that another writing is performed.

Next, rewriting of data will be described. Rewriting of data is performed similarly to the writing and holding of data. That is, the potential of the second line is set to potential which allows the transistor 162 to be turned on, so that the transistor 162 is turned on. Accordingly, the potential of the first line (potential related to new data) is supplied to the one electrode of the capacitor 164. After that, the potential of the second line is set to potential which allows the transistor 162 to be turned off, so that the transistor 162 is turned off. Accordingly, charge related to new data is given to the capacitor 164.

In the semiconductor device according to one embodiment of the disclosed invention, data can be directly rewritten by another writing of data as described above. Therefore, high-speed operation of the semiconductor device can be realized.

Note that in the above description, an n-channel transistor in which electrons are majority carriers is used. However, it is needless to say that a p-channel transistor in which holes are majority carriers can be used instead of the n-channel transistor.

(Embodiment 2)

In this embodiment, a manufacturing method of a semiconductor device using an oxide semiconductor, specifically a manufacturing method of the transistor 162, will be described with reference to FIGS. 3A to 3E.

First, the insulating layer 138 is formed over the substrate 200. After that, a conductive layer is formed over the insulating layer 138 and is selectively etched, so that the source or drain electrode 142a and the source or drain electrode 142b are formed (see FIG. 3A).

As the substrate 200, for example, a glass substrate can be used. Alternatively, as the substrate 200, as well as a glass substrate, an insulating substrate formed using an insulator such as a ceramic substrate, a quartz substrate, or a sapphire substrate, a semiconductor substrate formed using a semiconductor material such as silicon, a conductive substrate formed using a conductor such as metal or stainless steel, any of these substrate whose surface is covered with an insulating material, or the like can be used. Further, a flexible substrate such as plastic generally tends to have a low upper temperature limit, but can be used as the substrate 200 as long as the substrate can withstand processing temperatures in the later manufacturing steps.

The insulating layer 138 functions as a base and can be formed by a PVD method, a CVD method, or the like. The insulating layer 138 can be formed using a material containing an inorganic insulating material such as silicon oxide, silicon oxynitride, silicon nitride, hafnium oxide, aluminum oxide, or tantalum oxide. Note that it is preferable that the insulating layer 138 contain hydrogen or water as little as possible. A structure in which the insulating layer 138 is not provided can be employed.

The conductive layer can be formed by a PVD method such as a sputtering method, or a CVD method such as a plasma CVD method. As a material for the conductive layer, an element selected from aluminum, chromium, copper, tantalum, titanium, molybdenum, and tungsten; an alloy containing any of these elements as a component; or the like can be used. Moreover, one or more materials selected from manganese, magnesium, zirconium, and beryllium may be used. Alternatively, aluminum combined with one or more of elements selected from titanium, tantalum, tungsten, molybdenum, chromium, neodymium, and scandium may be used.

The conductive layer can have a single-layer structure or a layered structure including two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that in the case where the conductive layer has a single-layer structure of a titanium film or a titanium nitride film, there is an advantage that the conductive layer is easily processed into the source or drain electrode 142a and the source or drain electrode 142b having tapered shapes.

Alternatively, the conductive layer may be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_2$—ZnO), or any of these metal oxide materials in which silicon or silicon oxide is included can be used.

The conductive layer is preferably etched so that edge portions of the source or drain electrode 142a and the source or drain electrode 142b are tapered. Here, a taper angle is preferably greater than or equal to 30° and less than or equal to 60°, for example. Note that a "taper angle" means an inclination angle formed by the side surface and the bottom surface of the layer having a tapered shape (e.g., the source or drain electrode 142a) when being observed in a direction perpendicular to the cross section (plane which is perpendicular to the surface of the substrate). The edge portions of the source or drain electrode 142a and the source or drain electrode 142b are etched so as to be tapered; accordingly, the coverage of the gate insulating layer 146 to be formed later is improved and disconnection can be prevented.

The channel length (L) of the transistor is determined by a distance between a lower edge portion of the source or drain electrode 142a and a lower edge portion of the source or drain electrode 142b. Note that in the case where the channel length (L) of the transistor is 25 nm or less, light exposure for forming a mask is preferably performed with extreme ultraviolet rays whose wavelength is short of several nanometers to several tens of nanometers. The resolution of light exposure with extreme ultraviolet rays is high and the depth of focus is large. For these reasons, the channel length (L) of the transistor to be formed later can be in the range of greater than or equal to 10 nm and less than or equal to 1000 nm (1 μm), and the circuit can operate at higher speed. Moreover, miniaturization can lead to low power consumption of a semiconductor device.

Note that an insulating layer may be formed over the source or drain electrode 142a and the source or drain electrode 142b. By providing the insulating layer, parasitic capacitance formed between a gate electrode to be formed later and the source or drain electrode 142a and between the gate electrode and the source or drain electrode 142b can be reduced.

Figure 3A:
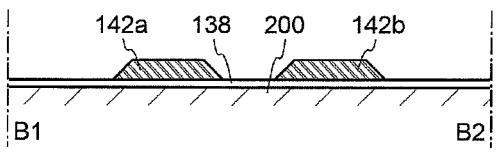
FIGS. 3A to 3E are cross-sectional views relating to manufacturing steps of a semiconductor device.
Figure 3B:
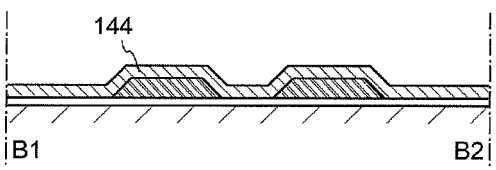

Next, the oxide semiconductor layer 144 is formed so as to cover the source or drain electrode 142a and the source or drain electrode 142b (see FIG. 3B).

The oxide semiconductor layer 144 can be formed using any of the following oxide semiconductors: a four-component metal oxide such as an In—Sn—Ga—Zn—O-based oxide semiconductor; three-component metal oxides such as an In-Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor; two-component metal oxides such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, and an In—Mg—O-based oxide semiconductor; and single-component metal oxides such as an In—O-based oxide semiconductor, a Sn—O-based oxide semiconductor, and a Zn—O-based oxide semiconductor.

In particular, an In—Ga—Zn—O-based oxide semiconductor material has sufficiently high resistance when there is no electric field and thus off current can be sufficiently reduced. In addition, with high field-effect mobility, the In—Ga—Zn—O-based oxide semiconductor material is suitable for a semiconductor material used in a semiconductor device.

As a typical example of the In—Ga—Zn—O-based oxide semiconductor material, one represented by $InGaO_3(ZnO)_m$ (m>0 and m is not limited to a natural number) is given. Using M instead of Ga, there is an oxide semiconductor material expressed by $InMO_3(ZnO)_m$ (m>0 and m is not limited to a natural number). Here, M denotes one or more of metal elements selected from gallium (Ga), aluminum (Al), iron (Fe), nickel (Ni), manganese (Mn), cobalt (Co), and the like. For example, M may be Ga, Ga and Al, Ga and Fe, Ga and Ni, Ga and Mn, Ga and Co, or the like. Note that the above-described compositions are derived from the crystal structures that the oxide semiconductor material can have and are only examples.

As a target for forming the oxide semiconductor layer 144 by a sputtering method, a target having a composition ratio of In:Ga:Zn=1:x:y (x is 0 or more and y is more than or equal to 0.5 and less than or equal to 5) is preferably used. For example, a target having a composition ratio of $In_2O_3$:$Ga_2O_3$:ZnO=1:1:2 [molar ratio], or the like can be used. Alternatively, a target having a composition ratio of $In_2O_3$:$Ga_2O_3$:ZnO=1:1:1 [molar ratio], a target having a composition ratio of $In_2O_3$:$Ga_2O_3$:ZnO=1:1:4 [molar ratio], or a target having a composition ratio of $In_2O_3$:ZnO=1:2 [molar ratio] can be used.

In this embodiment, the oxide semiconductor layer 144 having an amorphous structure is formed by a sputtering method using an In—Ga—Zn—O-based metal oxide target.

It is preferable that a metal oxide contained in the metal oxide target have a relative density of 80% or higher, preferably 95% or higher, more preferably 99.9% or higher. With the use of the metal oxide target with high relative density, the oxide semiconductor layer 144 having a dense structure can be formed.

The atmosphere in which the oxide semiconductor layer 144 is formed is preferably a rare gas (typically argon) atmosphere, an oxygen atmosphere, or a mixed atmosphere of a rare gas (typically argon) and oxygen. Specifically, it is preferable to use a high-purity gas atmosphere, for example, from which an impurity such as hydrogen, water, a hydroxyl group, or a hydride is removed so that the concentration is 1 ppm or lower (preferably 10 ppb or lower).

In forming the oxide semiconductor layer 144, the substrate is held in a treatment chamber that is maintained at reduced pressure and is heated so that the substrate temperature is higher than or equal to 100° C. and lower than 550° C., preferably higher than or equal to 200° C. and lower than or equal to 400° C. Alternatively, the substrate temperature in forming the oxide semiconductor layer 144 may be room temperature. Then, a sputtering gas from which hydrogen, water, and the like are removed is introduced while moisture in the treatment chamber is removed, whereby the oxide semiconductor layer 144 is formed using the above-described target. The oxide semiconductor layer 144 is formed while the substrate is heated, so that an impurity contained in the oxide semiconductor layer 144 can be reduced. Moreover, damage due to sputtering can be reduced. An entrapment vacuum pump is preferably used in order to remove moisture in the treatment chamber. For example, a cryopump, an ion pump, or a titanium sublimation pump can be used. A turbo pump provided with a cold trap may be used. By evacuation with the cryopump or the like, hydrogen, water, and the like can be removed from the treatment chamber, whereby the impurity concentration of the oxide semiconductor layer 144 can be reduced.

The oxide semiconductor layer 144 can be formed under the following conditions, for example: the distance between the substrate and the target is 170 mm; the pressure is 0.4 Pa; the direct-current (DC) power is 0.5 kW; and the atmosphere is an oxygen (the proportion of the oxygen flow is 100%) atmosphere, an argon (the proportion of the argon flow is 100%) atmosphere, or a mixed atmosphere of oxygen and argon. Note that it is preferable to use a pulse direct current (DC) power supply because powder substances (also referred to as particles or dust) generated in film deposition can be reduced and the thickness distribution can be uniform. The thickness of the oxide semiconductor layer 144 is greater than or equal to 1 nm and less than or equal to 50 nm, preferably greater than or equal to 1 nm and less than or equal to 30 nm, more preferably greater than or equal to 1 nm and less than or equal to 10 nm. Using the oxide semiconductor layer 144 with such a thickness can suppress a short-channel effect due to miniaturization. Note that an appropriate thickness differs depending on an oxide semiconductor material used, the usage of a semiconductor device, or the like; therefore, it is also possible to set the thickness as appropriate depending on the material to be used, the usage, or the like.

Note that before the oxide semiconductor layer 144 is formed by a sputtering method, a material attached to a surface over which the oxide semiconductor layer 144 is formed (e.g., a surface of the insulating layer 138) is preferably removed by reverse sputtering in which an argon gas is introduced and plasma is generated. Here, the reverse sputtering is a method by which ions collide with a surface to be processed so that the surface is modified, in contrast to normal sputtering by which ions collide with a sputtering target. An example of a method for making ions collide with a surface to be processed is a method in which high-frequency voltage is applied to the surface in an argon atmosphere so that plasma is generated near a substrate. Note that a nitrogen atmosphere, a helium atmosphere, an oxygen atmosphere, or the like may be used instead of an argon atmosphere.

After that, heat treatment (first heat treatment) is preferably performed on the oxide semiconductor layer 144. Excess hydrogen (including water and a hydroxyl group) contained in the oxide semiconductor layer 144 can be removed by the first heat treatment; thus, the structure of the oxide semiconductor layer can be improved and defect levels in an energy gap can be reduced. The temperature of the first heat treatment is, for example, higher than or equal to 300° C. and lower than 550° C., or higher than or equal to 400° C. and lower than or equal to 500° C.

The heat treatment can be performed in such a way that, for example, an object is introduced into an electric furnace in which a resistance heating element or the like is used, and heated in a nitrogen atmosphere at 450° C. for an hour. The oxide semiconductor layer 144 is not exposed to the air during the heat treatment so that entry of water and hydrogen can be prevented.

The heat treatment apparatus is not limited to the electric furnace and may be an apparatus for heating an object by thermal radiation or thermal conduction from a medium such as a heated gas. For example, a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object by heat treatment, for example, nitrogen or a rare gas such as argon is used.

For example, as the first heat treatment, a GRTA process may be performed as follows. The object is put in an inert gas atmosphere that has been heated, heated for several minutes, and taken out from the inert gas atmosphere. The GRTA process enables high-temperature heat treatment for a short time. Moreover, the GRTA process can be employed even when the temperature exceeds the upper temperature limit of the object. Note that the inert gas may be changed to a gas containing oxygen during the process. This is because defect levels in an energy gap caused by oxygen deficiency can be reduced by performing the first heat treatment in an atmosphere containing oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is 6N (99.9999%) or higher, preferably 7N (99.99999%) or higher (i.e., the impurity concentration is 1 ppm or lower, preferably 0.1 ppm or lower).

In any case, the i-type (intrinsic) or substantially i-type oxide semiconductor layer 144 in which impurities are reduced by the first heat treatment is formed, which enables a transistor having extremely excellent characteristics to be realized.

The above heat treatment (first heat treatment) can be referred to as dehydration treatment, dehydrogenation treatment, or the like because of its effect of removing hydrogen, water, and the like. The dehydration treatment or dehydrogenation treatment can be performed, for example, after the oxide semiconductor layer is formed, after the gate insulating layer is formed, or after the gate electrode is formed. Such dehydration treatment or dehydrogenation treatment may be performed once or plural times.

Figure 3C:
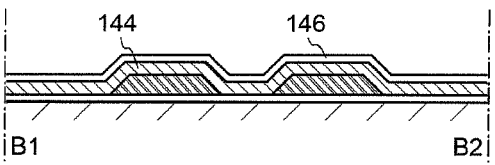

Next, the gate insulating layer 146 which is in contact with the oxide semiconductor layer 144 is formed (see FIG. 3C). The gate insulating layer 146 can be formed by a CVD method, a sputtering method, or the like. The gate insulating layer 146 is preferably formed so as to contain silicon oxide, silicon nitride, silicon oxynitride, aluminum oxide, tantalum oxide, hafnium oxide, yttrium oxide, hafnium silicate (Hf-$Si_xO_y$ (x>0, y>0)), hafnium silicate to which nitrogen is added ($HfSi_xO_yN_z$ (x>0, y>0, z>0)), hafnium aluminate to which nitrogen is added ($HfAl_xO_yN_z$ (x>0, y>0, z>0)), or the like. The gate insulating layer 146 may have a single-layer structure or a layered structure. There is no particular limitation on the thickness; however, in the case where a semiconductor device is miniaturized, the thickness is preferably small for ensuring operation of the transistor. For example, in the case where silicon oxide is used, the thickness can be set to greater than or equal to 1 nm and less than or equal to 100 nm, preferably greater than or equal to 10 nm and less than or equal to 50 nm.

As described above, when the gate insulating layer 146 is thin, there is a problem of gate leakage due to a tunneling effect or the like. In order to solve the problem of gate leakage, a high dielectric constant (high-k) material such as hafnium oxide, tantalum oxide, yttrium oxide, hafnium silicate ($HfSi_xO_y$ (x>0, y>0)), hafnium silicate to which nitrogen is added ($HfSi_xO_yN_z$ (x>0, y>0, z>0)), or hafnium aluminate to which nitrogen is added ($HfAl_xO_yN_z$ (x>0, y>0, z>0)) is preferably used for the gate insulating layer 146. By using a high-k material for the gate insulating layer 146, electrical characteristics can be ensured and the thickness can be large to prevent gate leakage. Note that a layered structure of a film containing a high-k material and a film containing any one of silicon oxide, silicon nitride, silicon oxynitride, silicon nitride oxide, aluminum oxide, and the like may be employed.

After the gate insulating layer 146 is formed, second heat treatment is desirably performed in an inert gas atmosphere or an oxygen atmosphere. The temperature of the heat treatment is set to higher than or equal to 200° C. and lower than or equal to 450° C., preferably higher than or equal to 250° C. and lower than or equal to 350° C. For example, the heat treatment may be performed at 250° C. for 1 hour in a nitrogen atmosphere. The second heat treatment can reduce variation in electrical characteristics of the transistor. Further, in the case where the gate insulating layer 146 contains oxygen, oxygen is supplied to the oxide semiconductor layer 144 to cover oxygen deficiency in the oxide semiconductor layer 144, so that an i-type (intrinsic semiconductor) or substantially i-type oxide semiconductor layer can be formed.

Note that the second heat treatment is performed in this embodiment after the gate insulating layer 146 is formed; the timing of the second heat treatment is not limited thereto. For example, the second heat treatment may be performed after the gate electrode is formed. Alternatively, the second heat treatment may be performed following the first heat treatment, the first heat treatment may double as the second heat treatment, or the second heat treatment may double as the first heat treatment.

Figure 3D:
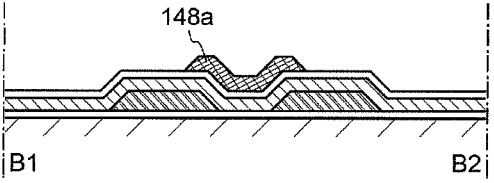

Next, the gate electrode 148a is formed over the gate insulating layer 146 in a region overlapping with the oxide semiconductor layer 144 (see FIG. 3D). The gate electrode 148a can be formed in such a manner that a conductive layer is formed over the gate insulating layer 146 and then selectively etched. The conductive layer to be the gate electrode 148a can be formed by a PVD method typified by a sputtering method or a CVD method such as a plasma CVD method. The details are similar to those of the source or drain electrode 142a or the like; thus, the description thereof can be referred to. Note that in forming the gate electrode 148a, the electrode 148b of the capacitor 164 in the above embodiment can also be formed.

Figure 3E:
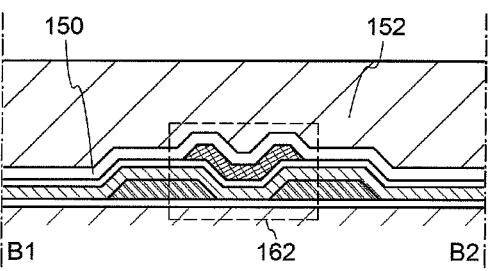

Next, the interlayer insulating layer 150 and the interlayer insulating layer 152 are formed over the gate insulating layer 146 and the gate electrode 148a (see FIG. 3E). The interlayer insulating layers 150 and 152 can be formed by a PVD method, a CVD method, or the like. The interlayer insulating layers 150 and 152 can be formed using a material containing an inorganic insulating material such as silicon oxide, silicon oxynitride, silicon nitride, hafnium oxide, aluminum oxide, or tantalum oxide. Note that a layered structure of the interlayer insulating layers 150 and 152 is used in this embodiment, but one embodiment of the disclosed invention is not limited to this example. A single-layer structure or a layered structure including three or more layers can also be used. Alternatively, an interlayer insulating layer is not necessarily provided.

Note that the interlayer insulating layer 152 is desirably formed so as to have a planarized surface. This is because an electrode, a line, or the like can be favorably formed over the interlayer insulating layer 152 even in the case where the semiconductor device is miniaturized, for example. The interlayer insulating layer 152 can be planarized using a method such as CMP (chemical mechanical polishing).

Through the above steps, the transistor 162 using the highly purified oxide semiconductor layer 144 is completed (see FIG. 3E).

The transistor 162 illustrated in FIG. 3E includes the oxide semiconductor layer 144, the source or drain electrode 142a and the source or drain electrode 142b which are electrically connected to the oxide semiconductor layer 144, the gate insulating layer 146 covering the oxide semiconductor layer 144, the source or drain electrode 142a, and the source or drain electrode 142b, the gate electrode 148a over the gate insulating layer 146, the interlayer insulating layer 150 over the gate insulating layer 146 and the gate electrode 148a, and the interlayer insulating layer 152 over the interlayer insulating layer 150.

Since the oxide semiconductor layer 144 is highly purified in the transistor 162 illustrated in this embodiment, the hydrogen concentration is $5 \times 10^{19}$ atoms/cm$^3$ or lower, preferably $5 \times 10^{18}$ atoms/cm$^3$ or lower, more preferably $5 \times 10^{17}$ atoms/cm$^3$ or lower. In addition, the value of the carrier concentration of the oxide semiconductor layer 144 is sufficiently low (e.g., lower than $1 \times 10^{12}$/cm$^3$, preferably lower than $1.45 \times 10^{10}$/cm$^3$) in comparison with that of a general silicon wafer (approximately $1 \times 10^{14}$/cm$^3$). Thus, the off current is sufficiently small. For example, the off current density (a value obtained by dividing the off current by the channel width of the transistor) of the transistor 162 at room temperature is approximately 10 zA/μm to 100 zA/μm (1 zA (zeptoampere) is $1 \times 10^{-21}$ A).

With the use of the oxide semiconductor layer 144 which is highly purified and becomes intrinsic, the off current of the transistor can be sufficiently reduced. Then, by using such a transistor, a semiconductor device in which stored data can be stored for an extremely long time can be obtained.

The structures, methods, and the like described in this embodiment can be combined as appropriate with any of the structures, methods, and the like described in the other embodiments.

(Embodiment 3)

In this embodiment, a manufacturing method of a transistor using an oxide semiconductor (especially, an oxide semiconductor having an amorphous structure) will be described with reference to FIGS. 4A to 4E. The transistor can be used instead of the transistor 162 or the like in any of the above embodiments. A structure of the transistor according to this embodiment and the structure of the transistor according to any of the above embodiments are partly common to each other. Therefore, a difference is mainly described below. A top-gate transistor is described below as an example; however, a structure of the transistor is not limited to a top-gate structure.

First, an insulating layer 202 is formed over the substrate 200. After that, an oxide semiconductor layer 206 is formed over the insulating layer 202 (see FIG. 4A).

For example, the substrate 200 in any of the above embodiments can be used for the substrate 200 in this embodiment.

The insulating layer 202 corresponds to the insulating layer 138 in any of the above embodiments and functions as a base. Any of the above embodiments can be referred to for details. Note that a structure in which the insulating layer 202 is not provided can also be employed.

The oxide semiconductor layer 206 corresponds to the oxide semiconductor layer 144 in any of the above embodiments. Any of the above embodiments can be referred to for the details of the material, the manufacturing method, and the like that can be used.

In this embodiment, the oxide semiconductor layer 206 having an amorphous structure is formed by a sputtering method using an In—Ga—Zn—O-based metal oxide target.

Next, the oxide semiconductor layer 206 is processed by a method such as etching using a mask, so that an island-shaped oxide semiconductor layer 206a is formed.

As an etching method for the oxide semiconductor layer 206, either dry etching or wet etching may be employed. It is needless to say that dry etching and wet etching can be used in combination. The etching conditions (e.g., an etching gas or an etchant, etching time, and temperature) are set as appropriate depending on the material so that the oxide semiconductor layer can be etched into a desired shape.

An example of an etching gas used for dry etching is a gas containing chlorine (a chlorine-based gas such as chlorine ($Cl_2$), boron trichloride ($BCl_3$), silicon tetrachloride ($SiCl_4$), or carbon tetrachloride ($CCl_4$)). Moreover, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like may be used.

As the dry etching method, a parallel plate RIE (reactive ion etching) method or an ICP (inductively coupled plasma) etching method can be used. In order to etch the oxide semiconductor layer into a desired shape, etching conditions (e.g., the amount of electric power applied to a coiled electrode, the amount of electric power applied to an electrode on the object side, and the electrode temperature on the object side) are set as appropriate.

As an etchant used for wet etching, a mixed solution of phosphoric acid, acetic acid, and nitric acid or the like can be used. An etchant such as ITO07N (produced by KANTO CHEMICAL CO., INC.) may also be used.

The oxide semiconductor layer 206 is preferably etched so that edge portions of the oxide semiconductor layer 206a are tapered. Here, a taper angle is preferably greater than or equal to 30° and less than or equal to 60°, for example. Note that a "taper angle" means an inclination angle formed by the side surface and the bottom surface of the layer having a tapered shape (e.g., the oxide semiconductor layer 206a) when being observed in a direction perpendicular to the cross section (plane which is perpendicular to the surface of the object). The edge portions of the oxide semiconductor layer 206a are etched so as to be tapered; accordingly, the coverage of a source or drain electrode 208a and a source or drain electrode 208b to be formed later is improved and disconnection can be prevented.

After that, heat treatment (first heat treatment) is preferably performed on the oxide semiconductor layer 206a. Excess hydrogen (including water and a hydroxyl group) contained in the oxide semiconductor layer 206a can be removed by this first heat treatment; thus, the structure of the oxide semiconductor layer can be improved and defect levels in an energy gap can be reduced. The above embodiments can be referred to for details. In the case where the heat treatment (first heat treatment) is performed after the etching as described here, even when wet etching is used, etching can be performed in a state where the etching rate is high; therefore, there is an advantage in that time required for etching can be shortened.

Note that the first heat treatment can be performed on the oxide semiconductor layer 206 that has not yet been processed into the island-shaped oxide semiconductor layer 206a. In that case, after the first heat treatment, the substrate 200 is taken out of the heating apparatus and a photolithography step is performed.

The above heat treatment (first heat treatment) can be referred to as dehydration treatment, dehydrogenation treatment, or the like because of its effect of removing hydrogen, water, and the like. The dehydration treatment or dehydrogenation treatment can be performed, for example, after the oxide semiconductor layer is formed, after the source and drain electrodes are formed over the oxide semiconductor layer 206a, or after a gate insulating layer is formed. Such dehydration treatment or dehydrogenation treatment may be performed once or plural times.

Next, a conductive layer is formed so as to be in contact with the oxide semiconductor layer 206a. The conductive layer is selectively etched, so that the source or drain electrode 208a and the source or drain electrode 208b are formed (see FIG. 4B). The description regarding the conductive layer, the source or drain electrode, and the like in any of the above embodiments can be referred to for the details of the conductive layer, the source or drain electrode 208a, the source or drain electrode 208b, and the like.

Figure 4A:
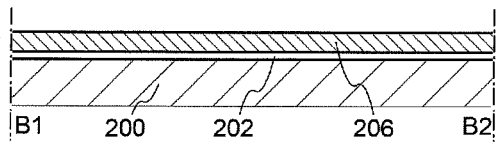
FIGS. 4A to 4E are cross-sectional views relating to manufacturing steps of a semiconductor device.
Figure 4B:
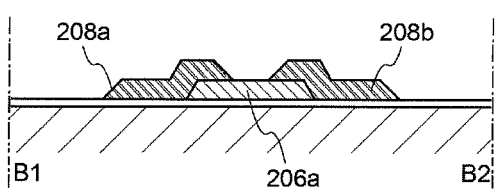
Figure 4C:
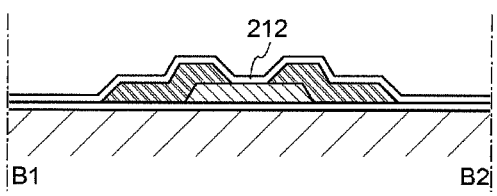

Next, a gate insulating layer 212 which is in contact with part of the oxide semiconductor layer 206a is formed (see FIG. 4C). The description regarding the gate insulating layer and the like in any of the above embodiments can be referred to for the details of the gate insulating layer 212.

After the gate insulating layer 212 is formed, second heat treatment is desirably performed in an inert gas atmosphere or an oxygen atmosphere. The above embodiment can be referred to for the details of the second heat treatment.

Note that the second heat treatment is performed in this embodiment after the gate insulating layer 212 is formed; the timing of the second heat treatment is not limited thereto. For example, the second heat treatment may be performed after the gate electrode is formed.

Figure 4D:
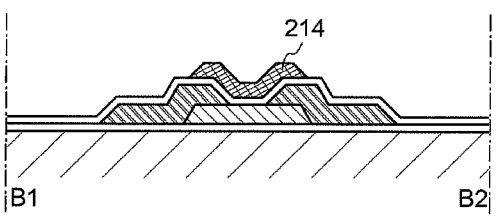

Next, a gate electrode 214 is formed over the gate insulating layer 212 in a region overlapping with the oxide semiconductor layer 206a (see FIG. 4D). The gate electrode 214 can be formed in such a manner that a conductive layer is formed over the gate insulating layer 212 and then selectively etched. The above embodiment can be referred to for the details of the gate electrode 214. Note that in forming the gate electrode 214, the electrode of the capacitor in any of the above embodiments can be also formed.

Figure 4E:
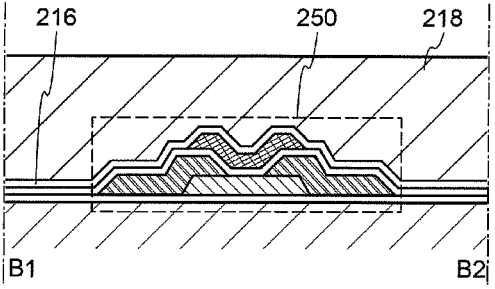

Next, an interlayer insulating layer 216 and an interlayer insulating layer 218 are formed over the gate insulating layer 212 and the gate electrode 214 (see FIG. 4E). The above embodiment can be referred to for details. Note that an interlayer insulating layer is not necessarily provided.

Through the above steps, a transistor 250 using the highly purified oxide semiconductor layer 206a having an amorphous structure is completed (see FIG. 4E). Note that crystal components slightly may exist in the oxide semiconductor layer 206a depending on conditions of the heat treatment.

With the use of the oxide semiconductor layer 206a which is highly purified and becomes intrinsic, the off current of the transistor can be sufficiently reduced. Then, by using such a transistor, a semiconductor device in which stored data can be stored for an extremely long time can be obtained.

Note that in this embodiment, a structure in which lower portions of a source and drain electrodes and an upper portion of an oxide semiconductor layer are in contact with each other in a top-gate transistor is described; however, a transistor to which the structure in this embodiment can be applied is not limited thereto. For example, part of the structure in this embodiment can be applied to a structure in which upper portions of a source and drain electrodes and a lower portion of an oxide semiconductor layer are in contact with each other (the structure illustrated in FIG. 1A, FIG. 1B, FIG. 1C, FIG. 1D, FIGS. 3A to 3E, or the like) in a top-gate transistor. Alternatively, part of the structure in this embodiment can be applied to a structure in which lower portions of a source and drain electrodes and an upper portion of an oxide semiconductor layer are in contact with each other in a bottom-gate transistor, a structure in which upper portions of a source and drain electrodes and a lower portion of an oxide semiconductor layer are in contact with each other in a bottom-gate transistor, or the like. In other words, according to this embodiment, a variety of transistors including an oxide semiconductor having an amorphous structure can be realized.

The structures, methods, and the like described in this embodiment can be combined as appropriate with any of the structures, methods, and the like described in the other embodiments.

(Embodiment 4)

In this embodiment, a manufacturing method of a transistor using an oxide semiconductor will be described with reference to FIGS. 5A to 5E. In this embodiment, the case where a first oxide semiconductor layer including a crystal region and a second oxide semiconductor layer formed by crystal growth from the crystal region of the first oxide semiconductor layer are used as an oxide semiconductor layer is described in detail. The transistor can be used instead of the transistor 162 or the like in any of the above embodiments. A structure of the transistor according to this embodiment and the structure of the transistor according to any of the above embodiments are partly common to each other. Therefore, a difference is mainly described below.

Note that when a thickness to be needed can be obtained just by the first oxide semiconductor layer, the second oxide semiconductor layer is not necessary. Further, an example of a top-gate transistor is described below; however, a structure of the transistor is not limited to a top-gate structure.

First, an insulating layer 302 is formed over a substrate 300. Next, a first oxide semiconductor layer is formed over the insulating layer 302 and a region including at least a surface of the first oxide semiconductor layer is crystallized by first heat treatment, so that a first oxide semiconductor layer 304 is formed (see FIG. 5A).

The above embodiment can be referred to for the details of the substrate 300.

The insulating layer 302 functions as a base. Any of the above embodiments can be referred to for the details of the insulating layer 302. Note that a structure in which the insulating layer 302 is not provided may be employed.

The first oxide semiconductor layer can be formed in a manner similar to that of the oxide semiconductor layer in any of the above embodiments. Thus, any of the above embodiments may be referred to for the details of the first oxide semiconductor layer and the manufacturing method thereof. Note that in this embodiment, the first oxide semiconductor layer is preferably formed using an oxide semiconductor which is easily crystallized, in order to crystallize the first oxide semiconductor layer intentionally by the first heat treatment. As such an oxide semiconductor, for example, ZnO is given. Among In—Ga—Zn—O-based oxide semiconductors, for example, one with high concentration of Zn is easily crystallized and one in which proportion of Zn in metal elements (In, Ga, and Zn) is 60 atomic % or higher is preferably used for this purpose. The thickness of the first oxide semiconductor layer is preferably set to greater than or equal to 1 nm and less than or equal to 10 nm. In this embodiment, the thickness is set to 3 nm as an example. Note that the appropriate thickness of the first oxide semiconductor layer differs depending on the oxide semiconductor material to be used, the usage of the semiconductor device, or the like; therefore, the thickness may be determined as appropriate in accordance with the material, the usage, or the like.

The temperature of the first heat treatment is set to higher than or equal to 550° C. and lower than or equal to 850° C., preferably higher than or equal to 600° C. and lower than or equal to 750° C. In addition, the length of time of the heat treatment is preferably greater than or equal to 1 minute and less than or equal to 24 hours. Note that the temperature of the heat treatment and the length of time of the heat treatment differ depending on the kind of the oxide semiconductor or the like.

In addition, the atmosphere of the first heat treatment is preferably an atmosphere which does not contain hydrogen, water, or the like. For example, a nitrogen atmosphere, an oxygen atmosphere, or a rare gas (helium, neon, argon, or the like) atmosphere, from which water is sufficiently removed can be employed.

As a heat treatment apparatus which can be used, there is an apparatus for heating an object by thermal conduction or thermal radiation from a medium such as a heated gas in addition to an electric furnace. For example, a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object by heat treatment, for example, nitrogen or a rare gas such as argon is used.

Through the above first heat treatment, the region including at least the surface of the first oxide semiconductor layer is crystallized. The crystal region is formed in such a manner that crystal growth proceeds from the surface of the first oxide semiconductor layer toward the inside of the first oxide semiconductor layer. Note that the crystal region includes plate-like crystals whose average thickness is greater than or equal to 1 nm and less than or equal to 10 nm in some cases. Further, the crystal region includes crystals whose c-axis is oriented in a direction substantially perpendicular to the surface of the oxide semiconductor layer in some cases. Here, a "substantially parallel direction" means a direction within ±10° from a parallel direction and a "substantially perpendicular direction" means a direction within ±10° from a perpendicular direction.

By the first heat treatment, hydrogen (including water and a hydroxyl group) or the like contained in the first oxide semiconductor layer is preferably removed while the crystal region is formed. In the case where hydrogen or the like is removed, the first heat treatment is preferably performed in a nitrogen atmosphere, an oxygen atmosphere, or a rare gas (helium, neon, argon, or the like) atmosphere whose purity is 6N (99.9999%) or higher (that is, the impurity concentration is 1 ppm or lower). More preferably, an atmosphere whose purity is 7N (99.99999%) or higher (that is, the impurity concentration is 0.1 ppm or lower) is used. The first heat treatment may be performed in ultra-dry air with an $H_2O$ concentration of 20 ppm or lower, preferably ultra-dry air with an $H_2O$ concentration of 1 ppm or lower.

Moreover, by the first heat treatment, oxygen is preferably supplied to the first oxide semiconductor layer while the crystal region is formed. For example, with the use of an oxygen atmosphere as the atmosphere of the heat treatment, oxygen can be supplied to the first oxide semiconductor layer.

The first heat treatment in this embodiment is as follows: hydrogen or the like is removed from the oxide semiconductor layer by heat treatment in a nitrogen atmosphere at 700° C. for 1 hour, and then the atmosphere is changed to an oxygen atmosphere so that oxygen is supplied to the inside of the first oxide semiconductor layer. Note that since a main object of the first heat treatment is formation of the crystal region, treatment for removing hydrogen or the like or treatment for supplying oxygen can be separately performed. For example, after the heat treatment for removing hydrogen or the like or treatment for supplying oxygen is performed, heat treatment for crystallization can be performed.

By such first heat treatment, the first oxide semiconductor layer which includes the crystal region, from which hydrogen (including water and a hydroxyl group) or the like is removed and to which oxygen is supplied can be obtained.

Figure 5A:
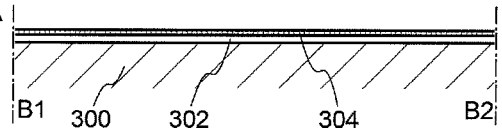
FIGS. 5A to 5E are cross-sectional views relating to manufacturing steps of a semiconductor device.
Figure 5B:
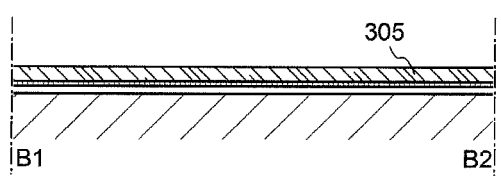

Next, a second oxide semiconductor layer 305 is formed over the first oxide semiconductor layer 304 including the crystal region in the region including at least the surface (see FIG. 5B). Note that when a thickness to be needed can be obtained just by the first oxide semiconductor layer 304, the second oxide semiconductor layer 305 is not necessary. In this case, steps relating to the second oxide semiconductor layer 305 can be omitted.

The second oxide semiconductor layer 305 can be formed in a manner similar to that of the oxide semiconductor layer in any of the above embodiments. Thus, any of the above embodiments may be referred to for the details of the second oxide semiconductor layer 305 and the manufacturing method thereof. Note that the second oxide semiconductor layer 305 is preferably formed thicker than the first oxide semiconductor layer 304. The second oxide semiconductor layer 305 is preferably formed so that the total thickness of the first oxide semiconductor layer 304 and the second oxide semiconductor layer 305 is greater than or equal to 1 nm and less than or equal to 50 nm, preferably greater than or equal to 1 nm and less than or equal to 10 nm. In this embodiment, the thickness is set to 7 nm as an example. Note that the appropriate thickness of the second oxide semiconductor layer differs depending on the oxide semiconductor material to be used, the usage of the semiconductor device, or the like; therefore, the thickness may be determined as appropriate in accordance with the material, the usage, or the like.

It is preferable that the second oxide semiconductor layer 305 be formed using a material which contains the same main component as the first oxide semiconductor layer 304 and lattice constants after crystallization of which is close to those of the first oxide semiconductor layer 304 (lattice mismatch is 1% or less). This is because when such a material is used, in the crystallization of the second oxide semiconductor layer 305, crystal growth using the crystal region of the first oxide semiconductor layer 304 as a seed crystal easily proceeds. Further, in the case where a material containing the same main component is used, favorable interface properties or electrical characteristics can be obtained.

Note that when desired film quality can be obtained by the crystallization, the second oxide semiconductor layer 305 may be formed using a material containing a different main component.

Figure 5C:
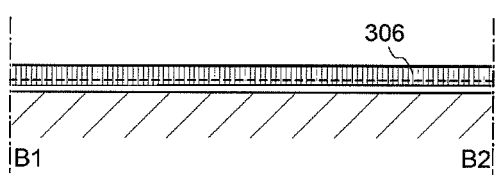

Next, the second heat treatment is performed on the second oxide semiconductor layer 305 to cause crystal growth using the crystal region of the first oxide semiconductor layer 304 as a seed crystal, so that a second oxide semiconductor layer 306 is formed (see FIG. 5C). In the case where the second oxide semiconductor layer 305 is not formed, the step can be omitted.

The temperature of the second heat treatment is set to higher than or equal to 550° C. and lower than or equal to 850° C., preferably higher than or equal to 600° C. and lower than or equal to 750° C. The length of time of the second heat treatment is greater than or equal to 1 minute and less than or equal to 100 hours, preferably greater than or equal to 5 hours and less than or equal to 20 hours, typically 10 hours. Note that it is preferable that also in the second heat treatment, hydrogen, water, and the like be not contained in the atmosphere of the heat treatment.

The details of the atmosphere and effects of the heat treatment are similar to those of the first heat treatment. In addition, a heat treatment apparatus which can be used is also similar to the apparatus in the first heat treatment. For example, at the time of increasing the temperature in the second heat treatment, the inside of a furnace is set to a nitrogen atmosphere and the inside of the furnace is set to an oxygen atmosphere at the time of performing cooling, whereby hydrogen or the like can be removed in a nitrogen atmosphere and oxygen can be supplied in an oxygen atmosphere.

By performing the second heat treatment as described above, crystal growth proceeds from the crystal region formed in the first oxide semiconductor layer 304 to the whole second oxide semiconductor layer 305, so that the second oxide semiconductor layer 306 can be formed. Further, the second oxide semiconductor layer 306 from which hydrogen (including water and a hydroxyl group) or the like is removed and to which oxygen is supplied can be formed. Furthermore, orientation of the crystal region of the first oxide semiconductor layer 304 can be improved by the second heat treatment.

In the case where an In—Ga—Zn—O-based oxide semiconductor material is used for the second oxide semiconductor layer 306, the second oxide semiconductor layer 306 can include a crystal represented by $InGaO_3(ZnO)_m$ (m is not limited to a natural number), a crystal represented by $In_2Ga_2ZnO_7$ (In:Ga:Zn:O=2:2:1:7 [atomic ratio]), or the like. Such a crystal is oriented so that the c-axis is in a substantially perpendicular direction to a surface of the second oxide semiconductor layer 306 by the second heat treatment.

Here, the above-described crystal has a layered structure of layers parallel to the a-axis and the b-axis. In addition, each layer contains In, Ga, or Zn. Specifically, the above-described crystal has a structure in which a layer containing In and a layer not containing In (a layer containing Ga or Zn) are stacked in the c-axis direction.

In an In—Ga—Zn—O-based oxide semiconductor crystal, the conductivity of the layer containing In in an in-plane direction, that is, in a direction parallel to the a-axis and the b-axis is favorable. This is due to the fact that electric conductivity is mainly controlled by In in the In—Ga—Zn—O-based oxide semiconductor crystal, the fact that the 5s orbital of one In atom overlaps with the 5s orbital of an adjacent In atom, so that a carrier path is formed, and the like.

In the case where the first oxide semiconductor layer 304 includes an amorphous region in the vicinity of the interface between the first oxide semiconductor layer 304 and the insulating layer 302, the second heat treatment may cause crystal growth from the crystal region formed on the surface of the first oxide semiconductor layer 304 toward the bottom surface of the first oxide semiconductor layer 304 and may crystallize the amorphous region in some cases. Note that depending on the material for forming the insulating layer 302, heat treatment conditions, or the like, the amorphous region may remain.

In the case where the first oxide semiconductor layer 304 and the second oxide semiconductor layer 305 are formed using oxide semiconductor materials containing the same main component, as illustrated in FIG. 5C, the first oxide semiconductor layer 304 and the second oxide semiconductor layer 306 have the same crystal structure in some cases. Therefore, although the boundary between the first oxide semiconductor layer 304 and the second oxide semiconductor layer 306 is indicated by a dotted line in FIG. 5C, it sometimes cannot be identified, and the first oxide semiconductor layer 304 and the second oxide semiconductor layer 306 can be sometimes regarded as one layer.

Figure 5D:
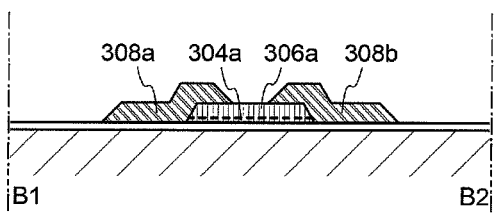

Next, the first oxide semiconductor layer 304 and the second oxide semiconductor layer 306 are processed by a method such as etching using a mask; thus, an island-shaped first oxide semiconductor layer 304a and an island-shaped second oxide semiconductor layer 306a are formed (see FIG. 5D). Note that processing into the island-shaped oxide semiconductor layers is performed after the second heat treatment here; however, the second heat treatment may be performed after the 30 processing into the island-shaped oxide semiconductor layers. In this case, even when wet etching is used, etching can be performed in a state where the etching rate is high; therefore, there is an advantage in that time required for etching can be shortened.

As a method for etching the first oxide semiconductor layer 304 and the second oxide semiconductor layer 306, either dry etching or wet etching may be employed. It is needless to say that dry etching and wet etching can be used in combination. The etching conditions (e.g., an etching gas or an etchant, etching time, and temperature) are set as appropriate depending on the material so that the oxide semiconductor layers can be etched into a desired shape. The first oxide semiconductor layer 304 and the second oxide semiconductor layer 306 can be etched in a manner similar to that of the oxide semiconductor layer in any of the above embodiments. Any of the above embodiments may be referred to for details.

Note that in the oxide semiconductor layer, a region to be a channel formation region preferably has a planarized surface. For example, the difference in height of the surface of the second oxide semiconductor layer 306 (P-V) is preferably 1 nm or less (preferably 0.5 nm or less) in a region overlapping with a gate electrode (the channel formation region). Note that the above-described difference in height can be measured, for example, in a region of 10 square micrometers.

Next, a conductive layer is formed so as to be in contact with the second oxide semiconductor layer 306a. The conductive layer is selectively etched, so that the source or drain electrode 308a and the source or drain electrode 308b are formed (see FIG. 5D). Any of the above embodiments may be referred to for details.

Note that in a step illustrated in FIG. 5D, a crystal region of the first oxide semiconductor layer 304a or the second oxide semiconductor layer 306a which is in contact with the source or drain electrode 308a and the source or drain electrode 308b becomes amorphous in some cases. Therefore, all regions of the first oxide semiconductor layer 304a and the second oxide semiconductor layer 306a are not necessarily crystalline.

Next, a gate insulating layer 312 which is in contact with part of the second oxide semiconductor layer 306a is formed. Any of the above embodiments may be referred to for details. After that, a gate electrode 314 is formed over the gate insulating layer 312 in a region overlapping with the first oxide semiconductor layer 304a and the second oxide semiconductor layer 306a. Next, an interlayer insulating layer 316 and an interlayer insulating layer 318 are formed over the gate insulating layer 312 and the gate electrode 314 (see FIG. 5E). Any of the above embodiments may be referred to for details.

After the gate insulating layer 312 is formed, third heat treatment is desirably performed in an inert gas atmosphere or an oxygen atmosphere. The temperature of the third heat treatment is set to higher than or equal to 200° C. and lower than or equal to 450° C., preferably higher than or equal to 250° C. and lower than or equal to 350° C. For example, the heat treatment may be performed at 250° C. for 1 hour in an atmosphere containing oxygen. The third heat treatment can reduce variation in electrical characteristics of the transistor. Further, in the case where the gate insulating layer 312 is an insulating layer containing oxygen, oxygen can be supplied to the second oxide semiconductor layer 306a.

Note that the third heat treatment is performed in this embodiment after the gate insulating layer 312 is formed; the timing of the third heat treatment is not limited thereto. Further, in the case where oxygen is supplied to the second oxide semiconductor layer 306a by another treatment, for example, the second heat treatment or the like, the third heat treatment may be omitted.

Figure 5E:
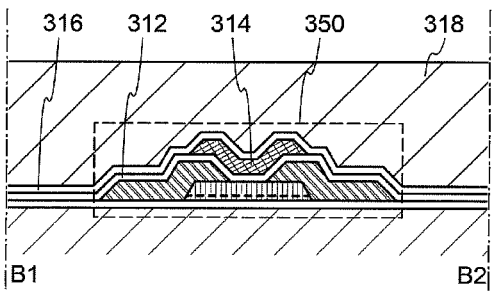

Through the above steps, a transistor 350 using the first oxide semiconductor layer 304a and the second oxide semiconductor layer 306a is completed (see FIG. 5E).

With the use of the first oxide semiconductor layer 304a and the second oxide semiconductor layer 306a which are highly purified and become intrinsic, the off current of the transistor can be sufficiently reduced. Then, by using such a transistor, a semiconductor device in which stored data can be stored for an extremely long time can be obtained.

Note that in this embodiment, a structure in which lower portions of a source and drain electrodes and an upper portion of an oxide semiconductor layer are in contact with each other in a top-gate transistor is described; however, a transistor to which the structure in this embodiment can be applied is not limited thereto. For example, part of the structure in this embodiment can be applied to a structure in which upper portions of a source and drain electrodes and a lower portion of an oxide semiconductor layer are in contact with each other (the structure illustrated in FIG. 1A, FIG. 1B, FIG. 1C, FIG. 1D or FIGS. 3A to 3E, or the like) in a top-gate transistor. Alternatively, part of the structure in this embodiment can be applied to a structure in which lower portions of a source and drain electrodes and an upper portion of an oxide semiconductor layer are in contact with each other in a bottom-gate transistor, a structure in which upper portions of a source and drain electrodes and a lower portion of an oxide semiconductor layer are in contact with each other in a bottom-gate transistor, or the like. In other words, according to this embodiment, a variety of transistors including an oxide semiconductor layer including a crystal region can be realized.

Further, in this embodiment, the first oxide semiconductor layer 304a including the crystal region and the second oxide semiconductor layer 306a formed by crystal growth from the crystal region of the first oxide semiconductor layer 304a are used as the oxide semiconductor layer; therefore, field-effect mobility can be improved and a transistor having favorable electrical characteristics can be realized. For example, it can be realized that field-effect mobility $\mu > 100$ cm$^2$/V·s. Thus, the above transistor can be applied to a variety of logic circuits which require high speed operation.

The structures, methods, and the like described in this embodiment can be combined as appropriate with any of the structures, methods, and the like described in the other embodiments.

(Embodiment 5)

In this embodiment, a manufacturing method of a transistor using an oxide semiconductor will be described with reference to FIGS. 6A to 6E. The transistor can be used instead of the transistor 162 or the like in any of the above embodiments. A structure of the transistor according to this embodiment and the structure of the transistor according to any of the above embodiments are partly common to each other. Therefore, a difference is mainly described below. Further, a top-gate transistor is described as an example below; however, a structure of the transistor is not limited to a top-gate structure.

First, an insulating layer 402 is formed over a substrate 400. Next, an oxide semiconductor layer 406 is formed over the insulating layer 402 (see FIG. 6A). Any of the above embodiments may be referred to for details.

Next, the oxide semiconductor layer 406 is processed by a method such as etching using a mask, so that an island-shaped oxide semiconductor layer 406a is formed. A conductive layer 408 and an insulating layer 410 are formed so as to cover the oxide semiconductor layer 406a (see FIG. 6B). Note that the insulating layer 410 is not an essential component but is effective in selectively oxidizing side surfaces of a source electrode and a drain electrode to be formed later. Further, it is also effective in reducing capacitance formed between the gate electrode and the source electrode and between the gate electrode and the drain electrode.

Any of the above embodiments can be referred to for the details of formation of the island-shaped oxide semiconductor layer 406a, heat treatment, and the like. Any of the above embodiments may be referred to for the details of the conductive layer 408.

The insulating layer 410 can be formed by a CVD method, a sputtering method, or the like. The insulating layer 410 is preferably formed so as to contain silicon oxide, silicon nitride, silicon oxynitride, aluminum oxide, hafnium oxide, tantalum oxide, or the like. Note that the insulating layer 410 may have a single-layer structure or a layered structure. There is no particular limitation on the thickness of the insulating layer 410. For example, the thickness can be set to greater than or equal to 10 nm and less than or equal to 200 nm.

Figure 6A:
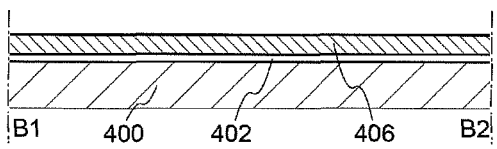
FIGS. 6A to 6E are cross-sectional views relating to manufacturing steps of a semiconductor device.
Figure 6B:
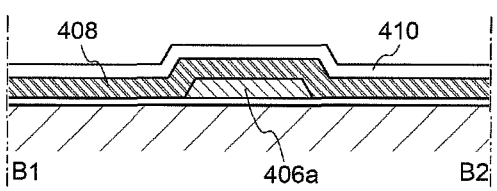
Figure 6C:
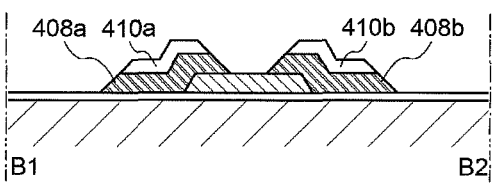

Next, the conductive layer 408 and the insulating layer 410 are selectively etched, so that a source or drain electrode 408a, a source or drain electrode 408b, an insulating layer 410a, and an insulating layer 410b are formed (see FIG. 6C). The details are similar to those of a formation step of the source or drain electrode in any of the above embodiments. Note that a material, for example, aluminum, titanium, molybdenum, copper, or the like, is suitable for plasma oxidation treatment to be performed later and suitable as a material of the source or drain electrode 408a, the source or drain electrode 408b, and the like.

Figure 6D:
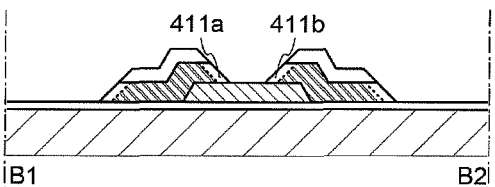
Figure 6E:
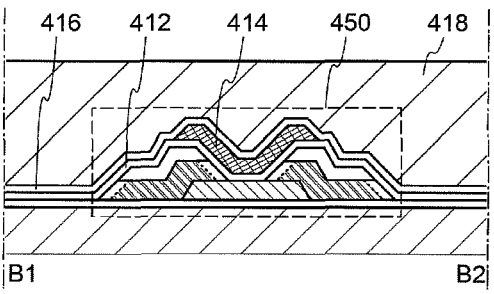

Next, oxidation treatment for supplying oxygen to the oxide semiconductor layer 406a is performed (see FIG. 6D). By the oxidation treatment, an oxide region 411a is formed in part of the source or drain electrode 408a (especially, portion corresponding to the side surface) and an oxide region 411b is formed in part of the source or drain electrode 408b (especially, portion corresponding to the side surface) (see FIG. 6D). In addition, by the oxidation treatment, oxide regions are also formed in peripheral portions of the source or drain electrode 408a and the source or drain electrode 408b.

The oxidation treatment is preferably performed using oxygen plasma excited with a microwave (300 MHz to 300 GHz), which may be referred to as plasma oxidation treatment. The reason is that high-density plasma is realized by plasma excitation with a microwave and damage to the oxide semiconductor layer 406a can be sufficiently reduced.

Specifically, the above treatment can be performed, for example, at a frequency of 300 MHz to 300 GHz (typically 2.45 GHz) under a pressure of 50 Pa to 5000 Pa (typically 500 Pa) at a temperature of the object of 200° C. to 400° C. (typically 300° C.) with the use of a mixed gas of oxygen and argon.

By the above oxidation treatment, oxygen is supplied to the oxide semiconductor layer 406a. Therefore, damage to the oxide semiconductor layer 406a can be sufficiently reduced, and in addition, defect levels in an energy gap due to oxygen deficiency can be reduced. In other words, characteristics of the oxide semiconductor layer 406a can be further improved.

Note that without limitation to the plasma oxidation treatment with a microwave, any other method that enables a sufficient reduction in damage to the oxide semiconductor layer 406a and a supply of oxygen to the oxide semiconductor layer 406a can be used. For example, a method such as heat treatment in an atmosphere containing oxygen can be used.

In combination with the oxidation treatment, treatment for removing water, hydrogen, or the like from the oxide semiconductor layer 406a may be performed. In this case, for example, plasma treatment using a gas such as nitrogen or argon can be used.

Note that the oxide region 411a and the oxide region 411b formed by the oxidation treatment are effective particularly when a transistor 450 is miniaturized (for example, when the channel length is less than 1000 nm). With the miniaturization of the transistor, the gate insulating layer needs to have a smaller thickness. The reason why the oxide regions are provided is that the oxide regions can prevent short circuit between the gate electrode and the source or drain electrode, which may be caused by a reduction in thickness of the gate insulating layer or defective coverage therewith. Note that the oxide regions are sufficiently effective when having a thickness of 5 nm or more (preferably 10 nm or more).

The oxidation treatment is effective also in terms of improvement in film quality of an exposed portion of the insulating layer 402.

Note that the insulating layer 410a and the insulating layer 410b are important in that these insulating layers function to prevent oxidation of upper portions of the source or drain electrode 408a and the source or drain electrode 408b. This is because it is significantly difficult to perform the plasma treatment while the mask used for etching remains.

Next, a gate insulating layer 412 is formed in contact with part of the oxide semiconductor layer 406a without exposure to the air. Then, a gate electrode 414 is formed over the gate insulating layer 412 in a region overlapping with the oxide semiconductor layer 406a, and an interlayer insulating layer 416 and an interlayer insulating layer 418 are formed over the gate insulating layer 412 and the gate electrode 414 (see FIG. 6E). Any of the above embodiments can be referred to for details.

Through the above steps, the transistor 450 using an oxide semiconductor is completed.

In this embodiment, oxygen plasma treatment is performed on the oxide semiconductor layer 406a in order to supply oxygen to the oxide semiconductor layer 406a. Accordingly, the transistor 450 has better characteristics. Further, a region corresponding to a side surface of the source or drain electrode is oxidized; thus, short circuit between the gate electrode and the source electrode (or the drain electrode), which may be caused by reduction in thickness of the gate insulating layer, can be prevented. Furthermore, an appropriate off-set region can be formed by the oxide region 411a and the oxide region 411b; thus, change in an electric field from the oxide semiconductor layer to an interface with the source electrode (or the drain electrode) can be made small.

Moreover, by providing an insulating layer over the source electrode and the drain electrode, capacitance (parasitic capacitance) formed between the gate electrode and the source electrode and between the gate electrode and the drain electrode can be reduced and higher speed operation can be realized.

Note that in this embodiment, a structure in which lower portions of a source and drain electrodes and an upper portion of an oxide semiconductor layer are in contact with each other in a top-gate transistor is described; however, a transistor to which the structure in this embodiment can be applied is not limited thereto. For example, part of the structure in this embodiment can be applied to a structure in which lower portions of a source and drain electrodes and an upper portion of an oxide semiconductor layer are in contact with each other in a bottom-gate transistor. In other words, according to this embodiment, a variety of transistors including an oxide semiconductor to which oxygen is supplied, an electrode including an oxide region, and the like can be realized.

The structures, methods, and the like described in this embodiment can be combined as appropriate with any of the structures, methods, and the like described in the other embodiments.

(Embodiment 6)

In this embodiment, applications of the semiconductor device described in any of the above embodiments are described with reference to FIGS. 7A and 7B and FIGS. 8A to 8C.

Figure 7A:
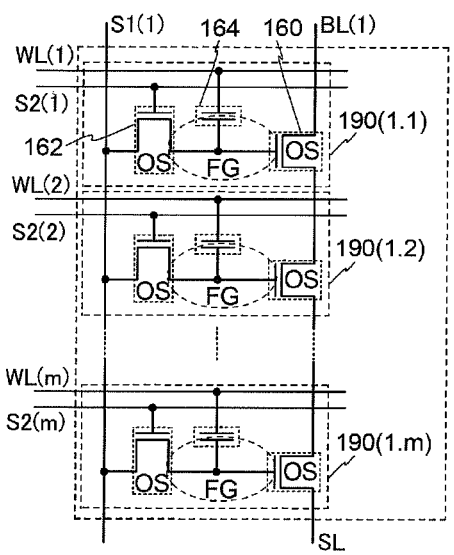
FIGS. 7A and 7B are circuit diagrams of a semiconductor device.
Figure 7B:
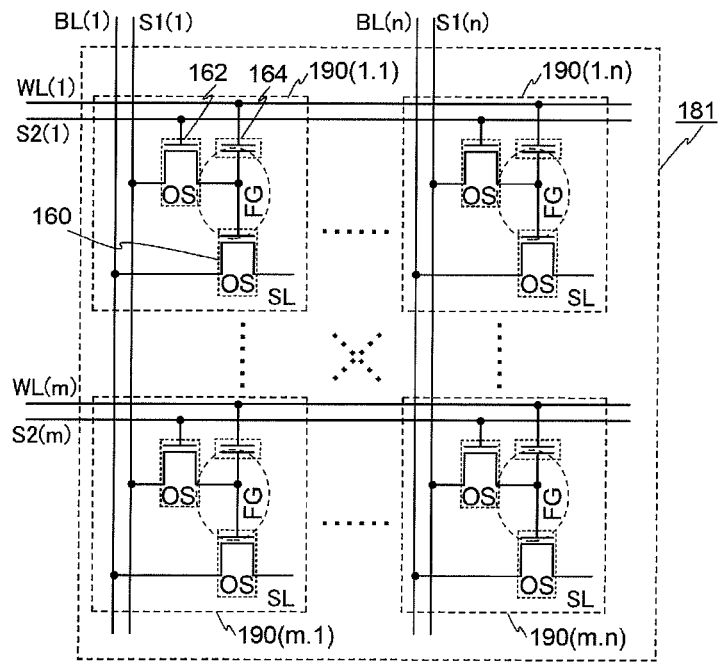

FIGS. 7A and 7B are examples of circuit diagrams of semiconductor devices each including a plurality of semiconductor devices (hereinafter also referred to as memory cells 190) illustrated in FIG. 2A1. FIG. 7A is a circuit diagram of a so-called NAND semiconductor device in which the memory cells 190 are connected in series, and FIG. 7B is a circuit diagram of a so-called NOR semiconductor device in which the 20 memory cells 190 are connected in parallel.

The semiconductor device in FIG. 7A includes a source line SL, a bit line BL, a first signal line SI, m second signal lines S2, m word lines WL, and a plurality of memory cells 190(1, 1) to 190(m, 1) which is arranged in a matrix of in (rows) (in a vertical direction)×1 (a column) (in a horizontal direction). Note that in FIG. 7A, one source line SL and one bit line BL are provided in the semiconductor device; however, one embodiment of the disclosed invention is not limited to this. n source lines SL and n bit lines BL may be provided so that a memory cell array where the memory cells are arranged in a matrix of m (rows) (in a vertical direction)×n (columns) (in a horizontal direction) is formed.

In each of the memory cells 190, a gate electrode of the transistor 160, one of a source electrode and a drain electrode of the transistor 162, and one electrode of the capacitor 164 are electrically connected to one another. The first signal line S1 and the other of the source electrode and the drain electrode of the transistor 162 are electrically connected to each other, and the second signal line S2 and a gate electrode of the transistor 162 are electrically connected to each other. The word line WL and the other electrode of the capacitor 164 are electrically connected to each other.

Further, a source electrode of the transistor 160 included in the memory cell 190 and a drain electrode of the transistor 160 included in the adjacent memory cell 190 are electrically connected to each other. The drain electrode of the transistor 160 included in the memory cell 190 and the source electrode of the transistor 160 included in the adjacent memory cell 190 are electrically connected to each other. Note that the drain electrode of the transistor 160 included in the memory cell 190 of the plurality of memory cells connected in series, which is provided at one end, and the bit line are electrically connected to each other. The source electrode of the transistor 160 included in the memory cell 190 of the plurality of memory cells connected in series, which is provided at the other end, and the source line are electrically connected to each other.

In the semiconductor device illustrated in FIG. 7A, writing operation and reading operation are performed in each row. The writing operation is performed as follows. Potential at which the transistor 162 is turned on is supplied to the second signal line S2 in a row where writing is performed, so that the transistor 162 in the row where writing is performed is turned on. Accordingly, the potential of the first signal line S1 is supplied to the gate electrode of the transistor 160 in the specified row, so that predetermined charge is given to the gate electrode. Thus, data can be written to the memory cell in the specified row.

Further, the reading operation is performed as follows. First, potential at which the transistor 160 is turned on regardless of charge of the gate electrode thereof is supplied to the word lines WL in the rows other than the row where reading is performed, so that the transistors 160 in the rows other than the row where reading is performed are turned on. Then, potential (reading potential) at which an on state or an off state of the transistor 160 is determined depending on charge of the gate electrode of the transistor 160 is supplied to the word line WL in the row where reading is performed. After that, predetermined potential is supplied to the source line SL so that a reading circuit (not illustrated) connected to the bit line BL operates. Here, the plurality of transistors 160 between the source line SL and the bit line BL are on except the transistor 160 in the row where reading is performed; therefore, conductance between the source line SL and the bit line BL is determined by a state of the transistor 160 in the row where reading is performed. That is, the potential of the bit line BL which is read by the reading circuit varies depending on charge of the gate electrode of the transistor 160 in the row where reading is performed. In this manner, data can be read from the memory cell in the specified row.

The semiconductor device illustrated in FIG. 7B includes n source lines SL, n bit lines BL, n first signal lines S1, m second signal lines S2, m word lines WL, and a memory cell array 181 including the plurality of memory cells 190(1, 1) to 190(m, n) which is arranged in a matrix of m (rows) (in a vertical direction) and n (columns) (in a horizontal direction). The gate electrode of the transistor 160, one of the source electrode and the drain electrode of the transistor 162, and the one electrode of the capacitor 164 are electrically connected to one another. The source line SL and the source electrode of the transistor 160 are electrically connected to each other. The bit line BL and the drain electrode of the transistor 160 are electrically connected to each other. The first signal line S1 and the other of the source electrode and the drain electrode of the transistor 162 are electrically connected to each other, and the second signal line S2 and a gate electrode of the transistor 162 are electrically connected to each other. The word line WL and the other electrode of the capacitor 164 are electrically connected to each other.

In the semiconductor device illustrated in FIG. 7B, writing operation and reading operation are performed in each row. The writing operation is performed in a manner similar to that in the semiconductor device illustrated in FIG. 7A. The reading operation is performed as follows. First, potential at which the transistor 160 is turned off regardless of charge of the gate electrode thereof is supplied to the word lines WL in the rows other than the row where reading is performed, so that the transistors 160 in the rows other than the row where reading is performed are turned off. Then, potential (reading potential) at which an on state or an off state of the transistor 160 is determined depending on charge of the gate electrode of the transistor 160 is supplied to the word line WL in the row where reading is performed. After that, predetermined potential is supplied to the source line SL so that a reading circuit (not illustrated) connected to the bit line BL operates. Here, conductance between the source line SL and the bit line BL is determined by a state of the transistors 160 in the row where reading is performed. That is, the potential of the bit line BL which is read by the reading circuit varies depending on charge of the gate electrodes of the transistors 160 in the row where reading is performed. In this manner, data can be read from the memory cells in the specified row.

Next, examples of reading circuits which can be used for the semiconductor devices illustrated in FIGS. 7A and 7B, or the like will be described with reference to FIGS. 8A to 8C.

Figure 8A:
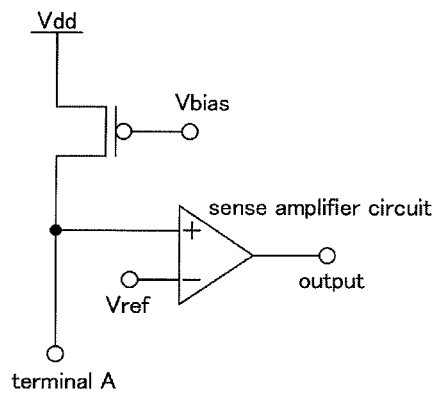
FIGS. 8A to 8C are circuit diagrams of a semiconductor device.

FIG. 8A illustrates an outline of a reading circuit. The reading circuit includes a transistor and a sense amplifier circuit.

At the time of reading of data, a terminal A is connected to a bit line to which a memory cell from which data is read is connected. Further, bias potential $V_{bias}$ is applied to a gate electrode of a transistor so that the potential of the terminal A is controlled.

The resistance of the memory cell 190 varies depending on stored data. Specifically, when the transistor 160 of the selected memory cell 190 is on, the memory cell 190 has low resistance, whereas when the transistor 160 of the selected memory cell 190 is off, the memory cell 190 has high resistance.

When the memory cell has high resistance, the potential of the terminal A is higher than reference potential $V_{ref}$ and the sense amplifier circuit outputs potential (data "1") corresponding to the potential of the terminal A. On the other hand, when the memory cell has low resistance, the potential of the terminal A is lower than the reference potential $V_{ref}$ and the sense amplifier circuit outputs potential (data "0") corresponding to the potential of the terminal A.

Thus, by using the reading circuit, data can be read from the memory cell. Note that the reading circuit of this embodiment is an example. Alternatively, another known circuit may be used. The reading circuit may further include a precharge circuit. Instead of the reference potential $V_{ref}$, a reference bit line may be connected to the sense amplifier circuit.

Figure 8B:
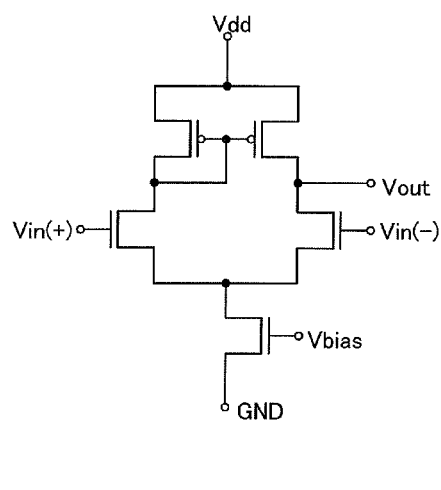

FIG. 8B illustrates a differential sense amplifier which is an example of sense amplifier circuits. The differential sense amplifier includes input terminals Vin(+) and Vin(−) and an output terminal Vout, and amplifies a difference between Vin(+) and Vin(−). Vout is approximately high output when Vin(+)>Vin(−), and is approximately low output when Vin(+)<Vin(−).

Figure 8C:
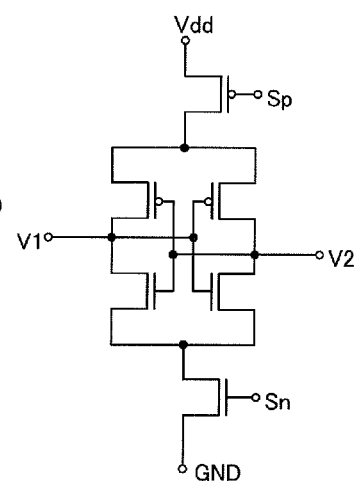

FIG. 8C illustrates a latch sense amplifier which is an example of sense amplifier circuits. The latch sense amplifier has input/output terminals V1 and V2 and input terminals of control signals Sp and Sn. First, the control signals Sp and Sn are set to a signal High and a signal Low, respectively, and power supply potential ($V_{dd}$) is interrupted. Then, potentials for comparison are supplied to V1 and V2. After that, the control signals Sp and Sn are set to a signal Low and a signal High, respectively, and power supply potential ($V_{dd}$) is supplied. If $V_{1in}>V_{2in}$ is satisfied for potentials for comparison $V_{1in}$ and $V_{2in}$, output from V1 is a signal High and output from V2 is a signal Low, whereas output from V1 is a signal Low and output from V2 is a signal High if $V_{1in}<V_{2in}$ is satisfied. By utilizing such a relation, the difference between $V_{1in}$ and $V_{2in}$ can be amplified.

The structures, methods, and the like described in this embodiment can be combined as appropriate with any of the structures, methods, and the like described in the other embodiments.

(Embodiment 7)

In this embodiment, examples of a semiconductor device using the transistor described in any of the above embodiments are described with reference to FIGS. 9A and 9B.

Figure 9A:
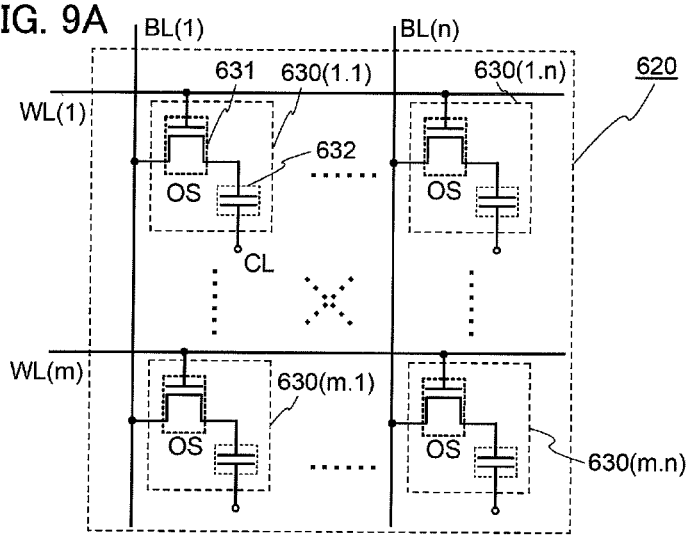
FIGS. 9A and 9B are circuit diagrams of a semiconductor device.

In FIG. 9A, an example of a semiconductor device having a structure corresponding to a so-called dynamic random access memory (DRAM) is illustrated. A memory cell array 620 illustrated in FIG. 9A has a structure in which a plurality of memory cells 630 is arranged in a matrix. Further, the memory cell array 620 includes m first lines and n second lines. Note that the memory cell 630 corresponds to the semiconductor device illustrated in FIG. 2B. Note also that in this embodiment, the first line and the second line in FIG. 2B are called a bit line BL and a word line WL, respectively.

The memory cell 630 includes a transistor 631 and a capacitor 632. A gate electrode of the transistor 631 is connected to the first line (word line WL). Further, one of a source electrode and a drain electrode of the transistor 631 is connected to the second line (bit line BL). The other of the source electrode and the drain electrode of the transistor 631 is connected to one electrode of the capacitor. The other electrode of the capacitor is connected to a capacitor line CL and is supplied with predetermined potential. The transistor described in any of the above embodiments is applied to the transistor 631.

The transistor described in any of the above embodiments has an extremely low off current. Accordingly, when the transistor is applied to the semiconductor device illustrated in FIG. 9A, which is regarded as a so-called DRAM, a substantially nonvolatile memory can be obtained.

Figure 9B:
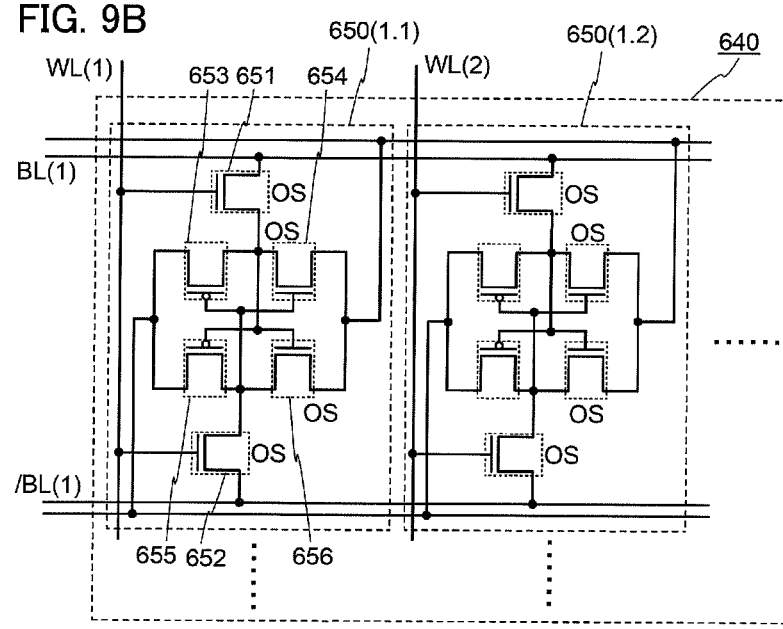

In FIG. 9B, an example of a semiconductor device having a structure corresponding to a so-called static random access memory (SRAM) is illustrated. A memory cell array 640 illustrated in FIG. 9B has a structure in which a plurality of memory cells 650 is arranged in a matrix. Further, the memory cell array 640 includes a plurality of first lines (word lines WL), a plurality of second lines (bit lines BL), and a plurality of third lines (inverted bit lines/BL).

The memory cell 650 includes first to sixth transistors 651 to 656. The first transistor 651 and the second transistor 652 function as selection transistors. Further, one of the third transistor 653 and the fourth transistor 654 (here, the fourth transistor 654) is an n-channel transistor and the other (here, the third transistor 653) is a p-channel transistor. In other words, a CMOS circuit is formed with the third transistor 653 and the fourth transistor 654. Similarly, a CMOS circuit is formed with the fifth transistor 655 and the sixth transistor 656.

The first transistor 651, the second transistor 652, the fourth transistor 654, and the sixth transistor 656 are n-channel transistors and the transistor described in any of the above embodiments can be applied to these transistors. The third transistor 653 and the fifth transistor 655 are p-channel transistors and can be formed using an oxide semiconductor or a material (e.g., silicon) other than an oxide semiconductor.

The structures, methods, and the like described in this embodiment can be combined as appropriate with any of the structures, methods, and the like described in the other embodiments.

(Embodiment 8)

In this embodiment, application of the semiconductor device described in any of the above embodiments to an electronic device is described with reference to FIGS. 10A to 10F. In this embodiment, application of the above-described semiconductor device to electronic devices such as a computer, a cellular phone (also referred to as a mobile phone or a mobile phone set), a portable information terminal (including a portable game machine, an audio reproducing device, and the like), a camera such as a digital camera or a digital video camera, electronic paper, and a television set (also referred to as a television or a television receiver) is described.

Figure 10A:
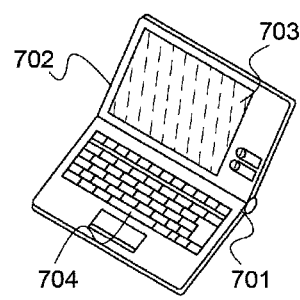
FIGS. 10A to 10F are diagrams each illustrating an electronic device which includes a semiconductor device.

FIG. 10A illustrates a laptop personal computer that includes a housing 701, a housing 702, a display portion 703, a keyboard 704, and the like. In each of the housings 701 and 702, the semiconductor device described in any of the above embodiments is provided. In the semiconductor device described in any of the above embodiments, writing and reading of data can be performed at high speed, data can be stored for a long time, and power consumption is sufficiently reduced. Therefore, a laptop personal computer in which writing and reading of data are performed at high speed, data is stored for a long time, and power consumption is sufficiently reduced can be realized.

Figure 10B:
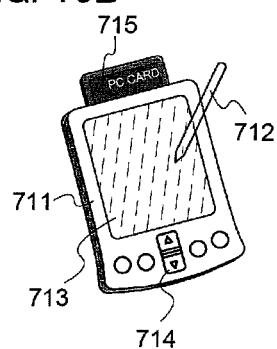

FIG. 10B illustrates a portable information terminal (personal digital assistance (PDA)). In a main body 711, a display portion 713, an external interface 715, an operation button 714, and the like are provided. Further, a stylus 712 and the like for operation of the portable information terminal are provided. In the main body 711, the semiconductor device described in any of the above embodiments is provided. In the semiconductor device described in any of the above embodiments, writing and reading of data can be performed at high speed, data can be stored for a long time, and power consumption is sufficiently reduced. Therefore, a portable information terminal in which writing and reading of data are performed at high speed, data is stored for a long time, and power consumption is sufficiently reduced can be realized.

Figure 10C:
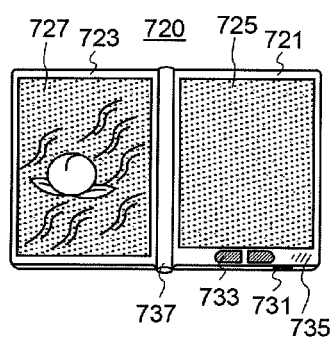

FIG. 10C illustrates an e-book reader 720 mounted with electronic paper, which includes two housings, a housing 721 and a housing 723. The housing 721 and the housing 723 are provided with a display portion 725 and a display portion 727, respectively. The housings 721 and 723 are connected by a hinge portion 737 and can be opened or closed with the hinge portion 737. The housing 721 is provided with a power supply 731, an operation key 733, a speaker 735, and the like. At least one of the housings 721 and 723 is provided with the semiconductor device described in any of the above embodiments. In the semiconductor device described in any of the above embodiments, writing and reading of data can be performed at high speed, data can be stored for a long time, and power consumption is sufficiently reduced. Therefore, an e-book reader in which writing and reading of data are performed at high speed, data is stored for a long time, and power consumption is sufficiently reduced can be realized.

Figure 10D:
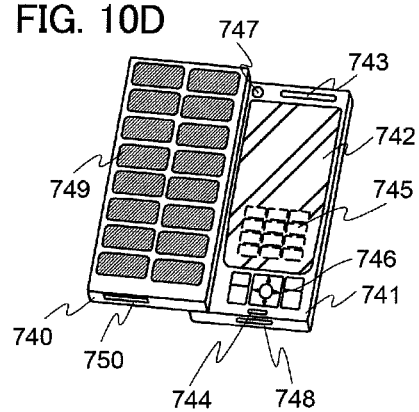

FIG. 10D illustrates a cellular phone which includes two housings, a housing 740 and a housing 741. Moreover, the housings 740 and 741 which are shown unfolded in FIG. 10D can overlap with each other by sliding; thus, the size of the cellular phone can be reduced, which makes the cellular phone suitable for being carried. The housing 741 includes a display panel 742, a speaker 743, a microphone 744, an operation key 745, a pointing device 746, a camera lens 747, an external connection terminal 748, and the like. The housing 740 includes a solar cell 749 for charging the cellular phone, an external memory slot 750, and the like. In addition, an antenna is incorporated in the housing 741. At least one of the housings 740 and 741 is provided with the semiconductor device described in any of the above embodiments. In the semiconductor device described in any of the above embodiments, writing and reading of data can be performed at high speed, data can be stored for a long time, and power consumption is sufficiently reduced. Therefore, a cellular phone in which writing and reading of data are performed at high speed, data is stored for a long time, and power consumption is sufficiently reduced can be realized.

Figure 10E:
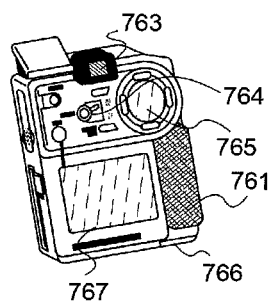

FIG. 10E illustrates a digital camera which includes a main body 761, a display portion 767, an eyepiece 763, an operation switch 764, a display portion 765, a battery 766, and the like. In the main body 761, the semiconductor device described in any of the above embodiments is provided. In the semiconductor device described in any of the above embodiments, writing and reading of data can be performed at high speed, data can be stored for a long time, and power consumption is sufficiently reduced. Therefore, a digital camera in which writing and reading of data are performed at high speed, data is stored for a long time, and power consumption is sufficiently reduced can be realized.

Figure 10F:
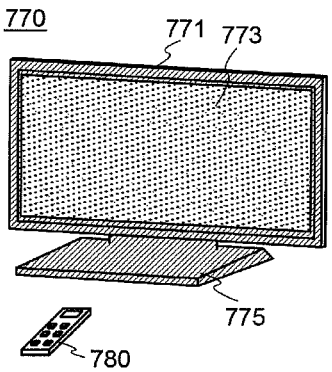

FIG. 10F illustrates a television set 770 which includes a housing 771, a display portion 773, a stand 775, and the like. The television set 770 can be operated with an operation switch of the housing 771 or a remote controller 780. The semiconductor device described in any of the above embodiments is mounted on the housing 771 and the remote controller 780. In the semiconductor device described in any of the above embodiments, writing and reading of data can be performed at high speed, data can be stored for a long time, and power consumption is sufficiently reduced. Therefore, a television set in which writing and reading of data are performed at high speed, data is stored for a long time, and power consumption is sufficiently reduced can be realized.

As described above, the semiconductor device in any of the above embodiments is mounted on each of the electronic devices described in this embodiment. Therefore, electronic devices in which power consumption is reduced can be realized.

EXAMPLE 1

The number of times when data can be rewritten in the semiconductor device according to one embodiment of the disclosed invention was examined. In this example, the examination results will be described with reference to FIG. 11.

A semiconductor device used for the examination is a semiconductor device having the circuit configuration in FIG.

2A1. Here, an oxide semiconductor was used for a transistor corresponding to the transistor 162, and a capacitor with a capacitance value of 0.33 pF was used as a capacitor corresponding to the capacitor 164.

The examination was performed by comparing the initial memory window width and the memory window width at the time after storing and writing of data were repeated predetermined times. Data was stored and written by applying 0 V or 5 V to a line corresponding to the third line in FIG. 2A1 and applying 0 V or 5 V to a line corresponding to the fourth line in FIG. 2A1. When the potential of the line corresponding to the fourth line is 0 V, the transistor corresponding to the transistor 162 is off; thus, a potential supplied to a floating gate portion FG is held. When the potential of the line corresponding to the fourth line is 5 V, the transistor corresponding to the transistor 162 is on; thus, the potential of the line corresponding to the third line is supplied to the floating gate portion FG.

The memory window width is one of indicators of characteristics of a memory device. Here, the memory window width represents the shift amount $\Delta V_{cg}$ in curves ($V_{cg}$-$I_d$ curves) between different memory states, which show the relation between the potential $V_{cg}$ of a line corresponding to the fifth line and drain current $I_d$ of a transistor corresponding to the transistor 160. The different memory states mean a state where 0 V is applied to the floating gate portion FG (hereinafter referred to as a Low state) and a state where 5 V is applied to the floating gate portion FG (hereinafter referred to as a High state). That is, the memory window width can be checked by sweeping the potential $V_{cg}$ in the Low state and in the High state. In any case, $V_{ds}$ was set to 1 V.

Figure 11:
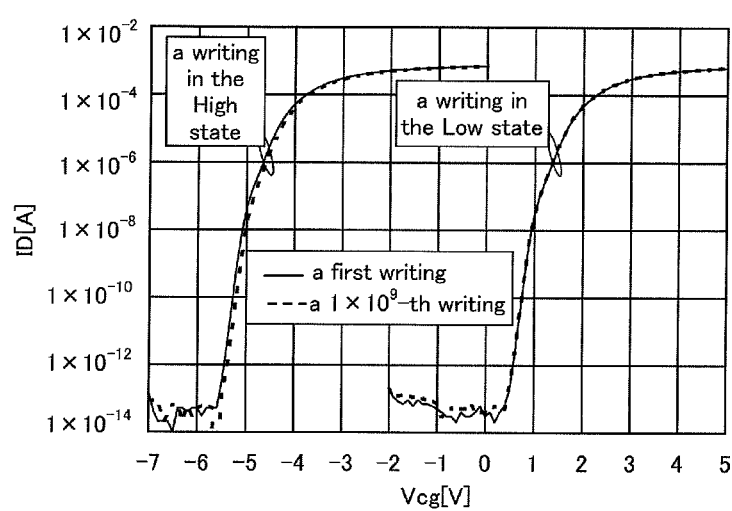
FIG. 11 is a graph showing examination results of a memory window width.

FIG. 11 shows the examination results of the memory window width at an initial state and the memory window width at the time after writing was performed $1\times10^9$ times. Note that in FIG. 11, each of solid lines shows a first writing and each of dashed lines shows a $1\times10^9$-th writing. Further, in both the solid lines and the dashed lines, a curve on the left side shows a writing in the High state and a curve on the right side shows a writing in the Low state. The horizontal axis shows $V_{cg}$ (V) and the vertical axis shows $I_d$ (A). According to FIG. 11, it can be confirmed that before and after data was written $1\times10^9$ times, the memory window width sweeping the potential $V_{cg}$ in the High state and the Low state was not changed. The memory window width was not changed after data was written $1\times10^9$ times, which means that at least during this period, the characteristics of the semiconductor device are not changed.

As described above, in a semiconductor device according to one embodiment of the disclosed invention, characteristics were not changed even after data was stored and written plural times. That is, it can be said that according to one embodiment of the disclosed invention, a significantly high reliable semiconductor device can be realized.

This application is based on Japanese Patent Application serial no. 2009-296201 filed with Japan Patent Office on Dec. 25, 2009, the entire contents of which are hereby incorporated by reference.

The invention claimed is:

1. A semiconductor device comprising:
 a transistor comprising:
  a source electrode and a drain electrode;
  an oxide semiconductor layer overlapping with the source electrode and the drain electrode; and
  a gate insulating layer overlapping with the oxide semiconductor layer, and
 a capacitor comprising the oxide semiconductor layer, one of the source electrode and the drain electrode, and an upper electrode, wherein the transistor has a top-gate structure, and
 wherein the oxide semiconductor layer directly contacts with the source electrode and the drain electrode.

2. The semiconductor device according to claim 1, wherein the capacitor further comprises the gate insulating layer between the one of the source electrode and the upper electrode.

3. The semiconductor device according to claim 1, wherein edge portions of the source electrode and the drain electrode are tapered.

4. A semiconductor device comprising:
 a transistor comprising:
  a source electrode and a drain electrode;
  an oxide semiconductor layer overlapping with the source electrode and the drain electrode; and
  a gate insulating layer overlapping with the oxide semiconductor layer, and
 a capacitor comprising:
  a pair of electrodes; and
  the oxide semiconductor layer between the pair of electrodes,
 wherein the transistor has a top-gate structure, and
 wherein one of the source electrode and the drain electrode of the transistor and one of the pair of electrodes of the capacitor are directly connected to each other.

5. The semiconductor device according to claim 4, wherein the capacitor further comprises the gate insulating layer between the pair of electrodes.

6. The semiconductor device according to claim 4, wherein edge portions of the source electrode and the drain electrode are tapered.

7. A semiconductor device comprising:
 a transistor comprising:
  a source electrode and a drain electrode;
  an oxide semiconductor layer over the source electrode and the drain electrode;
  a gate insulating layer over the oxide semiconductor layer; and
  a gate electrode over the gate insulating layer, and
 a capacitor comprising the oxide semiconductor layer,
 wherein one of the source electrode and the drain electrode of the transistor and one electrode of the capacitor are directly connected to each other.

8. The semiconductor device according to claim 7, wherein the capacitor further comprises the gate insulating layer between the one of the source electrode and the drain electrode and the other electrode of the capacitor.

9. The semiconductor device according to claim 7, wherein edge portions of the source electrode and the drain electrode are tapered.

10. The semiconductor device according to claim 1, wherein the transistor further comprises an insulating layer over the one of the source electrode and the drain electrode.

11. The semiconductor device according to claim 4, wherein the transistor further comprises an insulating layer over the one of the source electrode and the drain electrode.

12. The semiconductor device according to claim 7, wherein the transistor further comprises an insulating layer over the one of the source electrode and the drain electrode.

13. The semiconductor device according to claim 1, wherein the transistor further comprises a gate electrode over the gate insulating layer.

14. The semiconductor device according to claim 4, wherein the transistor further comprises a gate electrode over the gate insulating layer.

15. The semiconductor device according to claim 1, wherein the source electrode and the drain electrode is located over a substrate.

16. The semiconductor device according to claim 4 wherein the source electrode and the drain electrode is located over a substrate.

17. The semiconductor device according to claim 7, wherein the source electrode and the drain electrode is located over a substrate.

* * * * *

UNITED STATES PATENT AND TRADEMARK OFFICE
CERTIFICATE OF CORRECTION

PATENT NO. : 8,482,001 B2
APPLICATION NO. : 12/976582
DATED : July 9, 2013
INVENTOR(S) : Shunpei Yamazaki, Jun Koyama and Kiyoshi Kato Page 1 of 1

It is certified that error appears in the above-identified patent and that said Letters Patent is hereby corrected as shown below:

In the Specification

Column 5, line 2, replace "$5 \times 10^{12}$" with --$5 \times 10^{17}$--;

Column 9, line 16, replace "R2 ROS" with --$R2 \geqq ROS$--;

Column 11, line 40, replace "$In_2O_2$" with --$In_2O_3$--;

Column 23, line 43, before "processing" delete "30";

Column 27, line 57, before "memory" delete "20";

Column 27, line 59, replace "SI" with --S1--;

Column 27, line 61, replace "in" with --*m*--. (Second Occurrence)

Signed and Sealed this
Eighteenth Day of March, 2014

Michelle K. Lee
*Deputy Director of the United States Patent and Trademark Office*